(12) United States Patent
Uno et al.

(10) Patent No.: US 6,277,541 B1
(45) Date of Patent: *Aug. 21, 2001

(54) PHOTOSENSITIVE LITHOGRAPHIC PRINTING PLATE

(75) Inventors: Seiji Uno; Shiro Tan; Mitsuhiro Imaizumi; Keiji Akiyama, all of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/333,655

(22) Filed: Jun. 16, 1999

(30) Foreign Application Priority Data

Jun. 17, 1998 (JP) .................................................. 10-170202

(51) Int. Cl.⁷ ............................... G03C 1/77; G03C 1/93; G03F 7/022
(52) U.S. Cl. ...................... 430/278.1; 430/302; 430/306; 430/326; 430/270.1; 430/905; 430/906; 430/907; 430/910
(58) Field of Search ................................ 430/278.1, 302, 430/306, 905, 910, 906, 907, 919, 270.1, 326

(56) References Cited

U.S. PATENT DOCUMENTS

| 4,661,432 | * | 4/1987 | Lutz et al. ........................... 430/175 |
| 4,956,261 | * | 9/1990 | Pawlowski et al. ............... 430/271.1 |
| 5,728,793 | * | 3/1998 | Kumagai et al. ................... 526/329.7 |

FOREIGN PATENT DOCUMENTS

| 90 16 661 | 2/1991 | (DE) . |
| 0 110 417 | 6/1984 | (EP) . |
| 0 333 012 | 9/1989 | (EP) . |
| 0 871 070 | 10/1998 | (EP) . |
| 0904954 | * 3/1999 | (EP) . |
| 10 069092 | 3/1998 | (JP) . |

* cited by examiner

Primary Examiner—Janet Baxter
Assistant Examiner—Sin J. Lee
(74) Attorney, Agent, or Firm—Burns, Doane, Swecker & Mathis, LLP

(57) ABSTRACT

A photosensitive lithographic printing plate in which press life, deletion performance, photosensitive layer removability and image reproducibility are compatible with one another, while retaining scumming prevention performance, which comprises an aluminum support hydrophilized after anodic oxidization, an intermediate layer provided thereon containing an alkali-soluble polymer adjusted in a number-average molecular weight (Mn) to the range of 300 to 5,000 by using an initiator in combination with a chain transfer agent in radical polymerization, and a photosensitive layer provided on the intermediate layer.

13 Claims, No Drawings

PHOTOSENSITIVE LITHOGRAPHIC PRINTING PLATE

FIELD OF THE INVENTION

The present invention relates to a photosensitive lithographic printing plate, and particularly to a positive working photosensitive lithographic printing plate.

BACKGROUND OF THE INVENTION

In positive working photosensitive lithographic printing plates which have hitherto been widely used, only exposed portions of photosensitive layers are mainly removed by dissolution with developing solutions. In this case, non-image areas are generally developed with alkaline developing solutions mainly containing silicates having hydrophilization action.

This is for preventing the non-image areas from being stained with ink during printing by hydrophilization of the non-image areas with the silicate-containing alkaline developing solutions.

However, when the developing ability is somewhat decreased by exhaustion of developing solutions and developing replenishers, variation with the elapse of time of the positive working photosensitive lithographic printing plates, or insufficient exposure, the photosensitive layers of portions to form the non-image areas are not sufficiently removed by dissolution with the developing solutions, which causes residues of photosensitive layer components to remain on the plates in some cases.

When the photosensitive layer components remain on the non-image areas in the developing process as described above, the non-image areas can not be sufficiently hydrophilized only by the use of the silicates, resulting in the phenomenon of allowing ink to adhere to the non-image areas in the course of printing, namely the problem of developing scum.

Then, the present inventors have developed intermediate layers containing the polymers described in JP-A-10-69092 (the term "JP-A" as used herein means an "unexamined published Japanese patent application") as a method for retaining the adhesion between aluminum supports to which sufficient hydrophilicity is given and photosensitive layers during printing, and sufficiently removing the photosensitive layers and the intermediate layers by dissolving them with alkaline developing solutions in the non-image areas, thereby realizing the compatibility of press life with scumming prevention. This improves the adhesion of image areas, and in the non-image areas, the photosensitive layers and the intermediate layers can be sufficiently removed with the alkaline developing solutions. Accordingly, surfaces of the hydrophilized supports are exposed, and scumming prevention performance can also be maintained.

According to this method, however, deletion performance (image removability in removing unnecessary images using chemical agents generally called deletion fluids) is not sufficient, and particularly, significantly deteriorates with an increase in the area of images to be deleted. Further, there is the problem that binders contained in the photosensitive layers remain on the non-image areas of the supports, which causes the scum during printing (hereinafter referred to as photosensitive layer removability). It has been therefore desired to improve it.

SUMMARY OF THE INVENTION

It is therefore an object of the present invention to provide a photosensitive lithographic printing plate in which press life, deletion performance, photosensitive layer removability and image reproducibility are compatible with one another, using a hydrophilized support having scumming prevention performance. Further, another object of the present invention is to provide a photosensitive lithographic printing plate having good scumming prevention performance, press life, deletion performance, photosensitive layer removability and image reproducibility, even when it is developed using a developing solution containing no silicate.

As a result of intensive studies, the present inventors have discovered that the above-mentioned objects can be attained by adding a specific polymer adjusted in number-average molecular weight to a specified range, thus completing the present invention.

That is to say, the present invention provides a photosensitive lithographic printing plate comprising an aluminum support hydrophilized after anodic oxidation, an intermediate layer provided thereon containing an alkali-soluble polymer adjusted in a number-average molecular weight (Mn) to the range of 300 to 5,000 by using an initiator in combination with a chain transfer agent in radical polymerization, and a photosensitive layer provided on the intermediate layer.

Previously, for retaining the adhesion between the hydrophilized aluminum supports and the photosensitive layers during printing, and sufficiently removing the photosensitive layers and the intermediate layers by dissolving them with the alkaline developing solutions in the non-image areas, the intermediate layers containing the water-insoluble, alkali-soluble polymers have been developed, thereby realizing the compatibility of press life with scumming prevention. According to this method, however, deletion performance significantly deteriorates particularly with an increase in the area of images to be deleted. Further, an increase in hydrophilization action results in deterioration of photosensitive layer removability.

In contrast, it has become clear that, surprisingly, the polymer discovered according to the present invention, which is polymerized by using the initiator in combination with the chain transfer agent, and has a number-average molecular weight (Mn) ranging from 300 to 5,000, improves deletion performance, photosensitive layer removability and image reproducibility, as well as press life. This is presumedly because it becomes possible to control the adhesion of the polymer to the support and the solubility thereof in a solvent by adjusting the molecular weight of the polymer with an effective chain transfer agent effectively functions.

In addition, it has been known that chain transfer agent-derived functional groups introduced into ends of the polymer have a great influence on the adhesion and solubility of the polymer. It is therefore presumed that one of the important factors is that it has become possible to adjust the adhesion and solubility by the selection of the structure of the chain transfer agent.

DETAILED DESCRIPTION OF THE INVENTION

The polymers used for formation of the intermediate layers in the photosensitive lithographic printing plates of the present invention are described in detail below.

The polymers used in the present invention are compounds obtained by polymerizing constituents having at least acid groups. Further, compounds obtained by copolymerizing constituents having at least acid groups and constituents having at least onium groups are more preferred. The acid groups are preferably acid groups having an acid dissociation constant (pKa) of 7 or less, and more preferably —COOH, —SO₃H, —OSO₃H, —PO₃H₂, —OPO₃H₂, —CONHSO₂ and —SO₂NHSO₂—. —COOH is particularly preferred. The onium groups are preferably onium groups comprising the group V or IV atoms in the periodic table, and more preferably onium groups comprising nitrogen, phosphorus or sulfur atoms. Onium groups comprising nitrogen atoms are particularly preferred.

Of these polymers, polymers having vinyl polymers such as acrylic resins, methacrylic resins or polystyrene, urethane resins, polyesters or polyamides as main chains are preferred.

More preferably, the polymers are polymers having vinyl polymers such as acrylic resins, methacrylic resins or polystyrene as main chains.

Polymers are particularly preferred in which the constituents having acid groups are polymerizable compounds represented by the following general formula (1) or (2), and the constituents having onium groups are compounds represented by the following general formula (3), (4) or (5).

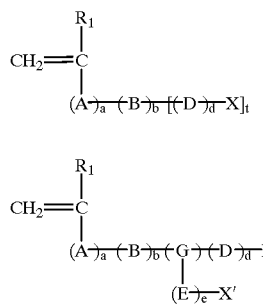

wherein A represents a divalent connecting group; B represents an aromatic group or a substituted aromatic group; D and E each independently represents a divalent connecting group; G represents a trivalent connecting group; X and X' each independently represents an acid group having a pKa of 7 or less, or an alkali metal salt or an ammonium salt thereof; $R_1$ represents a hydrogen atom, an alkyl group or a halogen atom; a, b, d and e each independently represents 0 or 1; and t is an integer of 1 to 3.

Of the acid group-containing constituents, more preferably, A represents —COO— or —CONH—; B represents a phenylene group or a substituted phenylene group, wherein the substituent group is a hydroxyl group, a halogen atom or an alkyl group; D and E each independently represents an alkylene group or a divalent connecting group having a molecular formula represented by $C_nH_{2n}O$, $C_nH_{2n}S$ or $C_nH_{2n+1}N$; G represents a trivalent connecting group having a molecular formula represented by $C_nH_{2n-1}$, $C_nH_{2n-1}O$, $C_nH_{2n-1}S$ or $C_nH_{2n}N$, wherein n indicates an integer of 1 to 12; X and X' each independently represents a carboxylic acid, a sulfonic acid, phosphonic acid, a monosulfate or a monophosphate; $R_1$ represents a hydrogen atom or an alkyl group; and a, b, d and e each independently indicates 0 or 1, but a and b are not 0 at the same time.

Of the acid group-containing constituents, compounds represented by general formula (1) are particularly preferred, wherein B represents a phenylene group or a substituted phenylene group, wherein the substituent group is a hydroxyl group or an alkyl group having 1 to 3 carbon atoms; D and E each independently represents an alkylene group having 1 or 2 carbon atoms, or an alkylene group having 1 or 2 carbon atoms connected with an oxygen atom;

$R_1$ represents a hydrogen atom or an alkyl group; X represents a carboxylic acid; and a is 0 and b is 1.

Specific examples of the acid group-containing constituents are shown below. However, the present invention is not limited to these specific examples.

(Specific Examples of Acid Group-Containing Constituents)

Acrylic acid, methacrylic acid, crotonic acid, isocrotonic acid, itaconic acid, maleic acid, maleic anhydride,

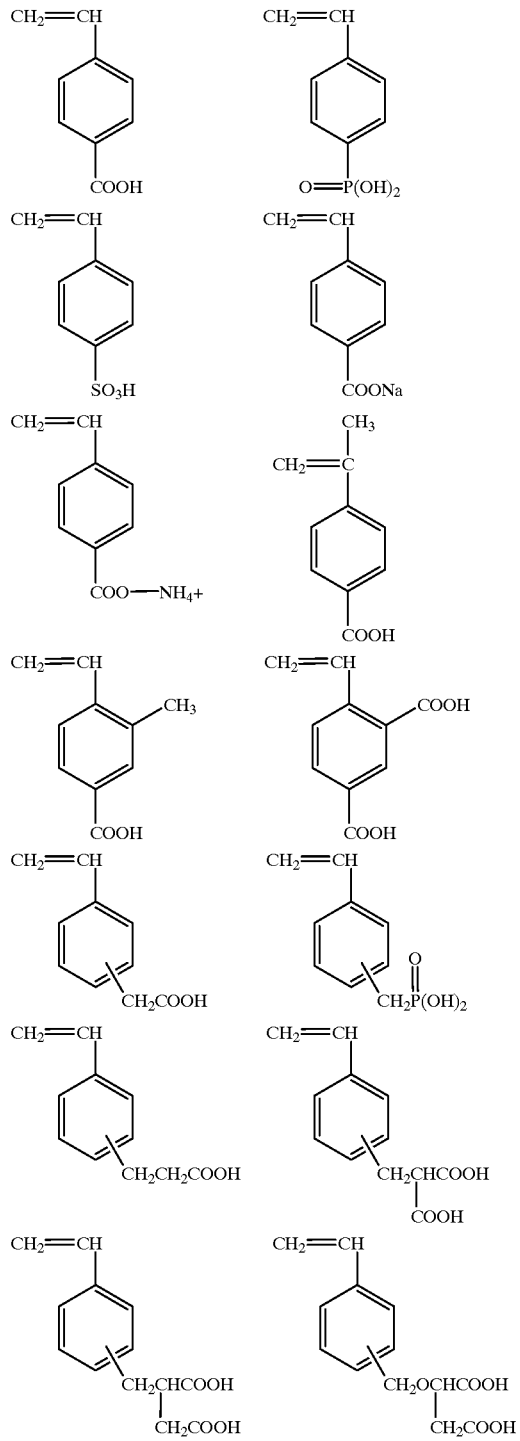

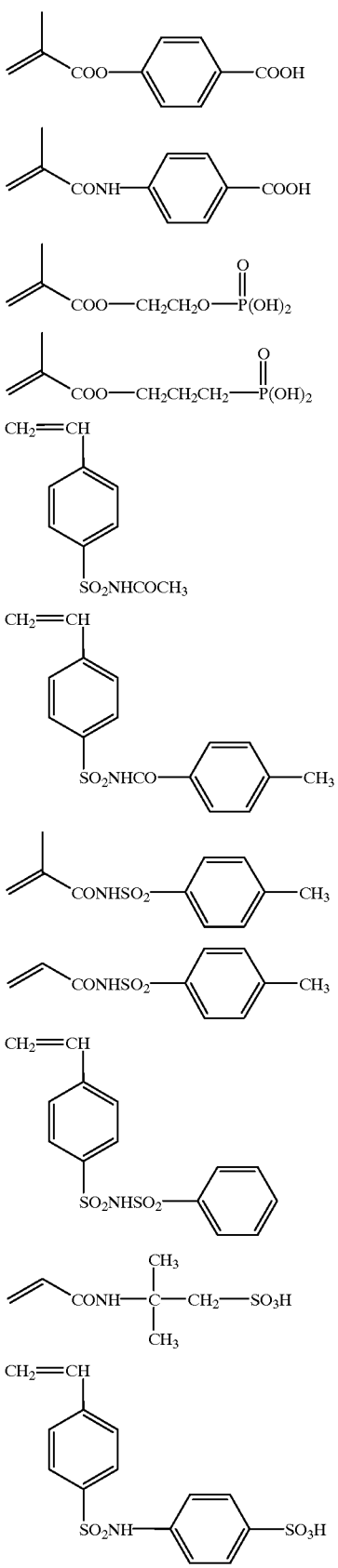

Then, the polymers in which the constituents having onium groups are represented by general formula (3), (4) or (5) are described below.

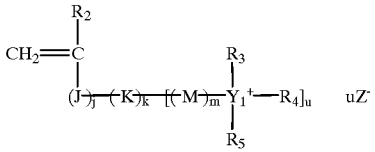

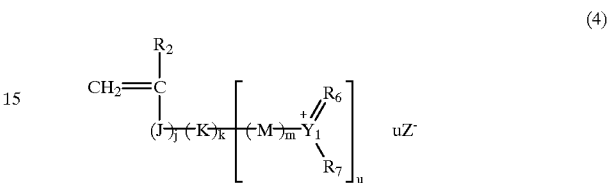

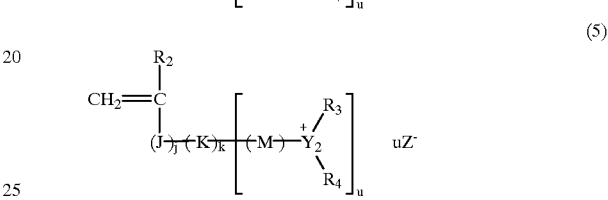

wherein J represents a divalent connecting group; K represents an aromatic group or a substituted aromatic group; M represents a divalent connecting group; $Y_1$ represents a group V atom in the periodic table, and $Y_2$ represents a group VI atom in the periodic table; $Z^-$ represents a counter anion; $R_2$ represents a hydrogen atom, an alkyl group or a halogen atom; $R_3$, $R_4$, $R_5$ and $R_7$ each independently represents a hydrogen atom, or an alkyl group, an aromatic group or an aralkyl group to which a substituent group may be bonded in some cases, and $R_6$ represents an alkylidine group or a substituted alkylidine group, wherein $R_3$ and $R_4$, or $R_6$ and $R_7$ may combine with each other to form a ring; j, k and m each independently indicates 0 or 1; and u indicates an integer of 1 to 3.

Of the onium group-containing constituents, more preferably, J represents —COO— or —CONH—; K represents a phenylene group or a substituted phenylene group, wherein the substituent group is a hydroxyl group, a halogen atom or an alkyl group; M represents an alkylene group or a divalent connecting group having a molecular formula represented by $C_nH_{2n}O$, $C_nH_{2n}S$ or $C_nH_{2n+1}N$, wherein n indicates an integer of 1 to 12; $Y_1$ represents a nitrogen atom of a phosphorus atom, and $Y_2$ represents a sulfur atom; $Z^-$ represents a halogen ion, $PF_6^-$, $BF_4^-$ or $R_8SO_3^-$; $R_2$ represents a hydrogen atom or an alkyl group; $R_3$, $R_4$, $R_5$ and $R_7$ each independently represents a hydrogen atom, or an alkyl group, an aromatic group or an aralkyl group of 1 to 10 carbon atoms, to which a substituent group may be bonded in some cases, and $R_6$ represents an alkylidine group or a substituted alkylidine group having 1 to 10 carbon atoms, wherein $R_3$ and $R_4$, or $R_6$ and $R_7$ may combine with each other to form a ring; j, k and m each independently indicates 0 or 1, but j and k are not 0 at the same time; and $R_8$ represents an alkyl group, an aromatic group or an aralkyl group of 1 to 10 carbon atoms, to which a substituent group may be bonded.

Of the onium group-containing constituents, particularly preferably, K represents a phenylene group or a substituted phenylene group, wherein the substituent group is a hydroxyl group or an alkyl group having 1 to 3 carbon atoms; M represents an alkylene group having 1 or 2 carbon atoms, or an alkylene group having 1 or 2 carbon atoms connected with an oxygen atom; $Z^-$ represents a chlorine ion or $R_8SO_3^-$; $R_2$ represents a hydrogen atom or a methyl group; j is 0 and k is 1; and $R_8$ represents an alkyl group having 1 to 3 carbon atoms.

Specific examples of the onium group-containing constituents are shown below. However, the present invention is not limited to these specific examples.

(Specific Examples of Onium Group-Containing Constituents)

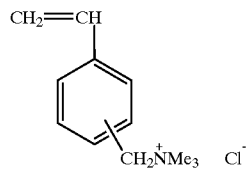 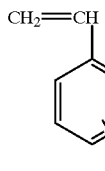

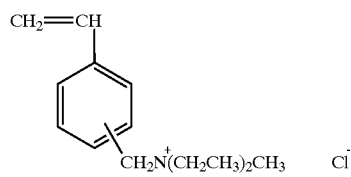

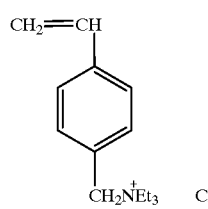

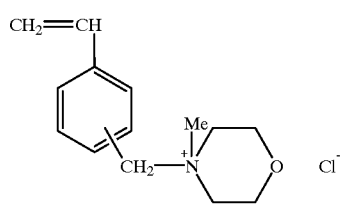

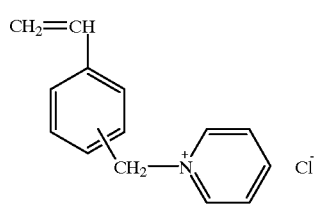

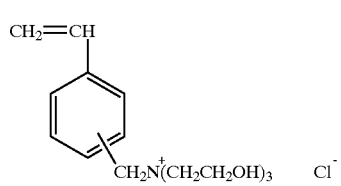

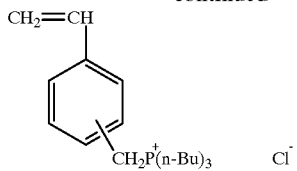

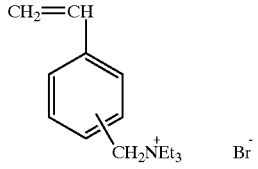

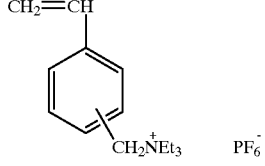

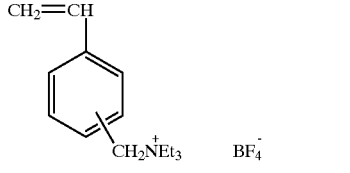

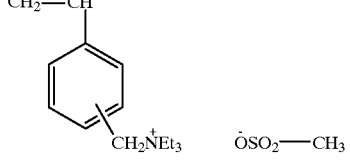

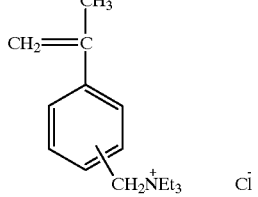

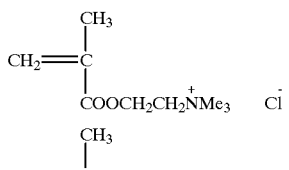

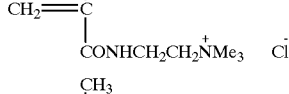

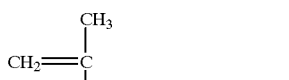

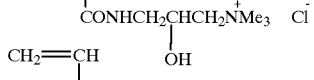

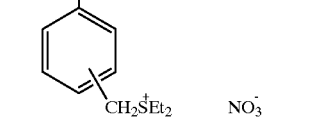

-continued

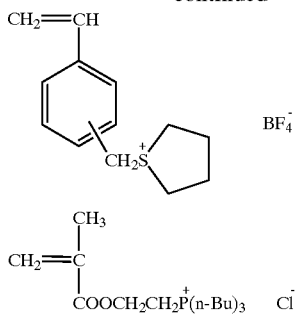

The acid group-containing monomers may be used either alone or as a combination of two or more of them, and the onium group-containing monomers may also be used either alone or as a combination of two or more of them. Further, the polymers in the present invention may be used as a mixture of two or more kinds of them different in the kind of monomer, composition ratio or molecular weight.

In this case, the polymers having the acid group-containing monomers as polymerization components contain the acid group-containing monomers preferably in an amount of 1 mol % or more, and more preferably in an amount of 5 mol % or more, and the polymers having the onium group-containing monomers as polymerization components contain the onium group-containing monomers preferably in an amount of 1 mol % or more, and more preferably in an amount of 5 mol % or more.

These polymers may each further contain as a copolymerization component at least one selected from the polymerizable monomers shown in the following (1) to (14).

(1) Aromatic hydroxyl group-containing acrylamides, methacrylamides, acrylates, methacrylates and hydroxystyrenes such as N-(4-hydroxyphenyl) acrylamide or N-(4-hydroxyphenyl)-methacrylamide, o-, m- or p-hydroxystyrene, o- or m-bromo-p-hydroxystyrene, o-, or m-chloro-p-hydroxystyrene and o-, m- or p-hydroxyphenyl acrylate or methacrylate;

(2) Unsaturated carboxylic acids such as acrylic acid, methacrylic acid, maleic acid, maleic anhydride and half esters thereof, and itaconic acid, itaconic anhydride and half esters thereof;

(3) Acrylamides such as N-(o-aminosulfonylphenyl) acrylamide, N-(m-aminosulfonylphenyl)acrylamide, N-(p-aminosulfonylphenyl)acrylamide, N-[1-(3-aminosulfonyl)naphthyl]acrylamide and N-(2-aminosulfonylethyl)acrylamide; methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide; and unsaturated sulfonamides of acrylates such as o-aminosulfonylphenyl acrylate, m-aminosulfonylphenyl acrylate, p-aminosulfonylphenyl acrylate, and 1-(3-aminosulfonylphenylnaphthyl) acrylate, and unsaturated sulfonamides of methacrylates such as o-aminosulfonylphenyl methacrylate, m-aminosulfonylphenyl methacrylate, p-aminosulfonylphenyl methacrylate, and 1-(3-aminosulfonylphenylnaphthyl) methacrylate; and (4) Phenylsulfonylacrylamides which may have substituent groups, such as tosylacrylamide, and phenylsulfonylmethacrylamides which may have substituent groups, such as tosylmethacrylamide.

In addition to these alkali-soluble group-containing monomers, film-forming resins in which monomers shown in the following (5) to (14) are copolymerized are preferably used.

(5) Acrylates and methacrylates having aliphatic hydroxyl groups, for example, 2-hydroxyethyl acrylate and 2-hydroxyethyl methacrylate;

(6) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(7) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(8) Acrylamides or methacrylamides such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(9) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(10) Vinyl esters such as vinyl acetate, vinyl chloroacetate, vinyl butyrate and vinyl benzoate;

(11) Styrenes such as a-methylstyrene, methylstyrene and chloromethylstyrene;

(12) Vinylketones such as methylvinylketone, ethylvinylketone, propylvinylketone and phenylvinylketone;

(13) Olefins such as ethylene, propylene, isobutylene, butadiene and isoprene; and

(14) N-Vinylpyrrolidone, N-vinylcarbazole, N-vinylpyridine, acrylonitrile and methacrylonitrile.

The polymers used herein contain the acid group-containing constituents preferably in an amount of 20% or more, more preferably in an amount of 40% or more, and the onium group-containing constituents preferably in an amount of 1 mol % or more, more preferably in an amount of 5 mol % or more. When the acid group-containing constituents are contained in an amount of 20% or more, the removal by dissolution in alkali development is further promoted. When the onium group-containing constituents are contained in an amount of 1 mol % or more, the adhesion is further improved by the synergistic effect with the acid groups.

The acid group-containing constituents may be used either alone or as a combination of two or more of them, and the onium group-containing constituents may also be used either alone or as a combination of two or more of them.

Further, the polymers in the present invention may be used as a mixture of two or more kinds of them different in the kind of constituent, composition ratio or molecular weight.

Typical examples of the polymers used in the present invention are shown below. The composition ratios of polymer structures are indicated by the mole percentage.

TABLE 1

TYPICAL EXAMPLES OF POLYMERS

| | Structure | Number-average Molecular Weight (Mn) |
|---|---|---|
| No. 1 | −(CH$_2$CH)$_{85}$− −(CH$_2$CH)$_{15}$− with pendant phenyl-COOH and phenyl-CH$_2$N$^+$Et$_3$ Cl$^-$ | 2,100 |
| No. 2 | −(CH$_2$CH)$_{85}$− −(CH$_2$CH)$_{10}$− −(CH$_2$CH)$_{5}$− with pendant phenyl-COOH, meta phenyl-CH$_2$N$^+$Et$_3$ Cl$^-$, and phenyl-CH$_2$N$^+$Et$_3$ Cl$^-$ | 4,800 |
| No. 3 | −(CH$_2$CH)$_{90}$− −(CH$_2$CH)$_{10}$− with pendant phenyl-COOH and phenyl-CH$_2$N$^+$Me$_3$ Cl$^-$ | 3,200 |
| No. 4 | −(CH$_2$CH)$_{40}$− −(CH$_2$CH)$_{60}$− with pendant phenyl-COOH and meta phenyl-CH$_2$P$^+$(n-Bu)$_3$ Cl$^-$ | 2,300 |
| No. 5 | −(CH$_2$CH)$_{50}$− −(CH$_2$CH)$_{50}$− with pendant phenyl-SO$_3$H and meta phenyl-CH$_2$-S$^+$(tetrahydrothiophene) · BF$_4^-$ | 1,400 |
| No. 6 | −(CH$_2$CH)$_{20}$− −(CH$_2$CH)$_{80}$− with pendant phenyl-SO$_3$Na and meta phenyl-CH$_2$N$^+$(n-Bu)$_3$ PF$_6^-$ | 4,500 |

TABLE 1-continued

TYPICAL EXAMPLES OF POLYMERS

| Structure | Number-average Molecular Weight (Mn) |
|---|---|
| No. 7: copolymer of $-(CH_2CH)_{70}-$ with pendant $C_6H_4\text{-}CH_2P(O)(OH)_2$ and $-(CH_2CH)_{30}-$ with pendant $C_6H_4\text{-}CH_2NMe_3^+\ Cl^-$ | 5,000 |
| No. 8: terpolymer $-(CH_2CH)_{60}-$ with $C_6H_4\text{-}COOH$, $-(CH_2CH)_{30}-$ with $C_6H_4\text{-}CH_2NEt_3^+\ Br^-$, and $-(CH_2CH)_{10}-$ with $C_6H_5$ | 1,000 |
| No. 9: terpolymer $-(CH_2C(CH_3))_{20}-COOH$, $-(CH_2C(CH_3))_{70}-COOCH_3$, $-(CH_2C(CH_3))_{10}-COOCH_2CH_2N(CH_3)_3^+\ Cl^-$ | 1,300 |
| No. 10: terpolymer $-(CH_2CH)_{70}-COOH$, $-(CH_2CH)_{15}-$ with $C_6H_4\text{-}CH_2\text{-}N^+\text{(pyridinium)}\ Cl^-$, $-(CH_2CH)_{15}-$ with $C_6H_4\text{-}CH_2\text{-}N^+\text{(N-methylmorpholinium)}\ Cl^-$ | 2,900 |
| No. 11: copolymer $-(CH_2C(CH_3))_{30}-COO\text{-}C_6H_4\text{-}COOH$ and $-(CH_2C(CH_3))_{70}-COOCH_2CH_2NEt_3^+\ Br^-$ | 800 |
| No. 12: copolymer $-(CH_2C(CH_3))_{55}-COOCH_2CH_2OP(O)(OH)_2$ and $-(CH_2C(CH_3))_{45}-CONHCH_2CH(OH)CH_2N(CH_3)_3^+\ Cl^-$ | 300 |
| No. 13: copolymer $-(CH_2C(CH_3))_{95}-CONH\text{-}C_6H_4\text{-}COOH$ and $-(CH_2CH)_{5}-$ with $C_6H_4\text{-}CH_2SEt_2^+\ PF_6^-$ | 1,900 |
| No. 14: terpolymer $-(CH_2CH)_{30}-CONH\text{-}C(CH_3)_2\text{-}CH_2\text{-}SO_3H$, $-(CH_2C(CH_3))_{30}-COOCH_2CH_2OH$, $-(CH_2C(CH_3))_{40}-COOCH_2CH_2NH(CH_3)_2^+\ Br^-$ | 4,100 |

TABLE 1-continued

TYPICAL EXAMPLES OF POLYMERS

| Structure | Number-average Molecular Weight (Mn) |
|---|---|
| No. 15 [structure with $-(CH_2CH)_{75}-$ phenyl-$SO_2NHCO$-phenyl-$CH_3$ and $-(CH_2CH)_{25}-$ pyridinium $I^-$, $CH_3$] | 3,500 |
| No. 16 [structure with $-(CH_2C)_{30}-$ with $CH_3$ and $CONHSO_2$-phenyl-$CH_3$; $-(CH_2CH)_{40}-CN$; $-(CH_2C)_{30}-$ with $CH_3$ and $COOCH_2CH_2\overset{+}{P}(n\text{-}Bu)_3 Cl^-$] | 3,000 |
| No. 17 [structure with $-(CH_2CH)_{10}-$ phenyl-$COOH$; $-(CH_2CH)_{80}-$ phenyl-$CH_2P(OH)_2$ with =O; $-(CH_2CH)_{10}-$ phenyl-$CH_2PPh_3\ Cl$] | 3,300 |
| No. 18 [structure with $-(CH_2CH)_{40}-COOH$; $-(CH_2CH)_{40}-CONH$-phenyl-$COOH$; $-(CH_2C)_{20}-$ with $CH_3$ and $COOCH_2CH_2\overset{+}{P}Et_3\ Cl^-$] | 600 |
| No. 19 [structure with $-(CH_2CH)_{50}-COOH$; $-(CH_2CH)_{20}-COOCH_2$-phenyl; $-(CH_2CH)_{30}-$ phenyl-$CH_2\overset{+}{N}(n\text{-}Bu)_3\ Br^-$] | 5,000 |
| No. 20 [structure with $-(CH_2C)_{60}-$ with $CH_3$ and $CONHSO_2$-phenyl-$CH_3$; $-(CH_2CH)_{20}-COOCH_3$; $-(CH_2CH)_{20}-$ phenyl-$CH_2\overset{+}{N}Et_3\ I^-$] | 2,400 |
| No. 21 [structure with $-(CH_2CH)_{30}-$ phenyl-$COOH$; $-(CH_2CH)_{30}-CONH$-phenyl-$CH_3$; $-(CH_2CH)_{40}-COOCH_2CH_2OH$] | 2,500 |

TABLE 1-continued

TYPICAL EXAMPLES OF POLYMERS

| | Structure | Number-average Molecular Weight (Mn) |
|---|---|---|
| No. 22 | 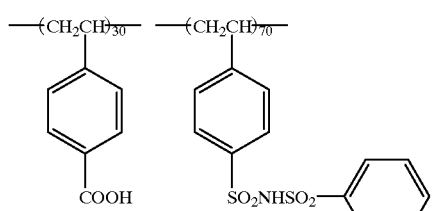 | 1,600 |
| No. 23 | 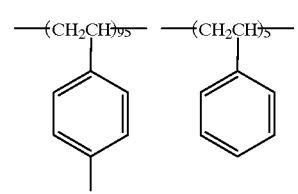 | 1,700 |
| No. 24 | 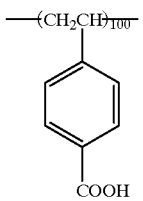 | 3,300 |

In general, the polymers used in the present invention can be produced by radical chain polymerization (refer to F. W. Billmeyer, *Textbook of Polymer Science*, 3rd ed., Wiley-Interscience Publication (1984)).

With respect to the molecular weight of the polymers used in the present invention, the number-average molecular weight (Mn) calculated from the integrated intensity ratio of terminal groups to side chain functional groups measured by NMR is from 300 to 5,000, preferably from 500 to 4,800, and more preferably from 800 to 4,500.

Less than 300 results in the decreased adhesion with substrates to cause deterioration of press life, whereas exceeding to 5,000 unsuitably results in the adhesion with substrates too high to sufficiently remove the photosensitive deterioration of deletion performance.

The amount of unreacted monomers contained in these polymers may be within a wide range, but is preferably 20% by weight or less, and more preferably 10% by weight or less.

The polymers having a molecular weight within the above-mentioned range can be obtained by adjusting the amount of polymerization initiators and chain transfer agents added in copolymerizing the corresponding monomers. The term "chain transfer agent" means a substance transferring an active point of a reaction by a chain transfer reaction in a polymerization reaction, and the ease of the transfer reaction is indicated by the chain transfer constant Cs.

The chain transfer constant $Cs \times 10^4$ (60° C.) of the chain transfer agents is preferably 0.01 or more, more preferably 0.1 or more, and particularly preferably 1 or more.

As the polymerization initiators, peroxides, azo compounds and redox initiators which are usually often used in radical polymerization can be used as such. Of these, the azo compounds are particularly preferred.

Specific examples of the chain transfer agents include but are not limited to halogen compounds such as carbon tetrachloride and carbon tetrabromide, alcohols such as isopropyl alcohol and isobutyl alcohol, olefins such as 2-methyl-1-butene and 2,4-diphenyl-4-methyl-1-pentene, and sulfur-containing compounds such as ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzyl mercaptan and phenetyl mercaptan.

Of these, ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzyl mercaptan and phenetyl mercaptan are more preferred, and ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide and 2-hydroxyethyl disulfide are particularly preferred.

Synthesis examples of the polymers used in the present invention are shown below.

[Synthesis Example 1] Synthesis of Polymer (No. 1)

In a 2-liter three neck flask, 50.4 g of p-vinylbenzoic acid (manufactured by Hokko Chemical Industry Co., Ltd.), 15.2 g of triethyl(p-vinylbenzyl)ammonium chloride, 1.9 g of mercaptoethanol and 153.1 g of methanol were placed, heated and maintained at 60° C. with stirring in a stream of nitrogen. To the resulting solution, 2.8 g of dimethyl 2,2'-azobis(isobutyrate) was added, and stirring was continued as such for 30 minutes. Then, a solution of 201.5 g of p-vinylbenzoic acid, 60.9 g of triethyl(p-vinylbenzyl) ammonium chloride, 7.5 g of mercaptoethanol and 11.1 g of 2,2'-azobis(isobutyrate) in 612.3 g of methanol was added dropwise for 2 hours. After the dropwise addition was completed, the temperature was elevated to 65° C., and stirring was continued in a stream of nitrogen for 10 hours. After the reaction was completed, the resulting reaction solution was allowed to cool down to room temperature. The yield of this reaction solution was 1132 g, and the solid content thereof was 30.5% by weight.

Further, the number-average molecular weight (Mn) of the resulting product was determined from a $^{13}C$-NMR spectrum. As a result, the value thereof was 2,100.

[Synthesis Example 2] Synthesis of Polymer (No. 2)

A polymer having a number-average molecular weight (Mn) of 4,800 was obtained by the same operations as with Synthesis Example 1 with the exception that a m-/p-form (2/1) mixture of triethyl(vinylbenzyl)ammonium chloride was used in place of triethyl(p-vinylbenzyl)ammonium chloride, and that ethyl mercaptopropionate was used in place of mercaptoethanol.

Other polymers used in the present invention can be synthesized in a similar manner.

In addition to the above-mentioned polymers, compounds represented by the following general formula (6) can also be further added to the intermediate layers of the photosensitive lithographic printing plates of the present invention.

$$(HO)_m\text{—}R_1\text{—}(COOH)_n \qquad (6)$$

wherein $R_1$ represents an arylene group having 6 to 14 carbon atoms, and m and n each independently indicates an integer of 1 to 3.

The compounds represented by the above-mentioned general formula (6) are described below.

The carbon number of the arylene group represented by $R_1$ is preferably from 6 to 14, and more preferably from 6 to 10.

Specific examples of the arylene groups represented by $R_1$ include phenylene, naphthyl, anthryl and phenanthryl groups.

The arylene group represented by $R_1$ may be substituted by alkyl of 1 to 10 carbon atoms, alkenyl of 2 to 10 carbon atoms, alkynyl of 2 to 10 carbon atoms, aryl of 6 to 10 carbon atoms, carbonate, alkoxyl, phenoxy, sulfonate, phosphonate, sulfonylamido, nitro, nitrile, amino, hydroxyl, halogen, ethylene oxide, propylene oxide or triethylammonium chloride.

Specific examples of the compounds represented by general formula (6) include but are not limited to 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid and 10-hydroxy-9-anthracenecarboxylic acid. Further, the compounds represented by general formula (6) may be used either alone or as a mixture of two or more kinds of them.

The intermediate layers containing the above-mentioned polymers used in the present invention and the above-mentioned compounds represented by general formula (6) optionally added are formed by coating on hydrophilized aluminum supports described later.

Methods for providing this intermediate layer include a coating method in which a solution of the polymer used in the present invention and a compound represented by general formula (6) optionally added in an organic solvent such as methanol, ethanol or methyl ethyl ketone, amixed solvent thereof, or a mixed solvent of the organic solvent and water is applied onto an aluminum support, and dried to form the intermediate layer, and a coating method in which an aluminum support is immersed in a solution of the polymer used in the present invention and a compound represented by general formula (6) optionally added in an organic solvent such as methanol, ethanol or methyl ethyl ketone, a mixed solvent thereof, or a mixed solvent of the organic solvent and water, followed by washing with water or air and drying to form the intermediate layer.

In the former method, the solution containing the above-mentioned compounds at a total concentration of 0.005% to 10% by weight can be applied by various methods. For example, any of bar coater coating, rotary coating, spray coating and curtain coating may be used. In the latter method, the concentration of the solution is from 0.005% to 20% by weight, and preferably from 0.01% to 10% by weight, the immersion temperature is from 0° C. to 70° C., and preferably from 5° C. to 60° C., and the immersion time is from 0.1 second to 5 minutes, and preferably 0.5 second to 120 seconds.

The above-mentioned solutions can also be used within the pH range of 0 to 12, more preferably 0 to 6 by adjusting the pH with basic substances such as ammonia, triethylamine and potassium hydroxide; inorganic acids such as hydrochloric acid, phosphoric acid, sulfuric acid and nitric acid; organic acidic substances such as organic sulfonic acids such as nitrobenzenesulfonic acid and naphthalenesulfonic acid, organic phosphonic acids such as phenylphosphonic acid, organic carboxylic acids such as benzoic acid, coumaric acid and malic acid; and organic chlorides such as naphthalenesulfonyl chloride and benzenesulfonyl chloride. Further, for improving the tone reproduction of the photosensitive lithographic printing plates, substances absorbing ultraviolet light, visible light or infrared light can also be added.

The amount of the compounds constituting the intermediate layers in the present invention coated is suitably from 1 mg/m² to 100 mg/m², and preferably from 2 mg/m² to 70 mg/m². If the above-mentioned amount coated is less than 1mg/m², the sufficient effect is not obtained. On the other hand, exceeding 100 mg/m² also brings about a similar result.

Of the photosensitive lithographic printing plates of the present invention, positive working photosensitive lithographic printing plates are described in the order of (1) supports, (2) photosensitive compositions and (3) development processing in detail below. In the present invention, the photosensitive lithographic printing plates are sometimes referred to as "PS plates".

[1] Supports

Supports used in the positive working photosensitive lithographic printing plates of the present invention and treatments thereof are described below.

(Aluminum Plates)

Aluminum plates used in the present invention are tabular materials formed of pure aluminum or aluminum alloys mainly composed of aluminum and containing a slight amount of different elements. The different elements include silicon, iron, manganese, copper, magnesium, chromium, zinc, bismuth, nickel and titanium. As to the alloy composition, the content of the different elements is 10% by weight or less. Aluminum suitable for the present invention is pure aluminum. However, it is difficult in terms of refining technology to produce completely pure aluminum, so that aluminum contain different elements as slightly as possible. The aluminum alloys having a different element content as described above can be said to be materials which can be used in the present invention. Thus, the aluminum plates used in the present invention are not particularly specified in composition, and materials conventionally known or used can be appropriately utilized. Preferred examples of the materials include JIS A 1050, JIS A 1100, JIS A 1200, JIS A 3003, JIS A 3103 and JIS A 3005. The thickness of the aluminum plates used in the present invention is from about 0.1 mm to about 0.6 mm. Prior to surface roughening of the aluminum plates, degreasing treatment for removing rolling oil on surfaces thereof is conducted, for example, with surface active agents or alkaline aqueous solutions if desired.

(Surface Roughening Treatment and Anodic Oxidization Treatment)

Methods for roughening the surfaces of the aluminum plates include methods of mechanically roughening the surfaces, methods of electrochemically roughening the surfaces by dissolution and methods of chemically selectively dissolving the surfaces. As the mechanical methods, known methods such as ball polishing, brushing, blasting and buffing can be used. The electrochemical roughening methods include methods of roughening the surfaces in electrolytic solutions of hydrochloric acid or nitric acid with alternating current or direct current. As described in JP-A-54-63902, methods in which both are combined can also be utilized.

The aluminum plates thus roughened are subjected to alkali etching treatment and neutralizing treatment as required, followed by anodic oxidization for enhancing the water receptivity and the wear resistance of the surfaces. As electrolytes used in anodic oxidization of the aluminum plates, any electrolytes can be used as long as they form porous oxide films. In general, sulfuric acid, phosphoric acid, oxalic acid, chromic acid and mixed acids thereof are used. The concentration of the electrolyte can be appropriately determined depending on the kind of electrolyte.

The conditions of anodic oxidation can not be specified without reservation, because they vary depending on the kind of electrolyte. However, an electrolyte concentration within the range of 1% to 80% by weight, a solution temperature within the range of 5° C. to 70° C., a current density within the range of 5 A/dm$^2$ to 60 A/dm$^2$, a voltage within the range of 1 V to 100 V and an electrolytic time within the range of 10 seconds to 5 minutes are generally proper.

The amount of anodic oxide films is properly 1.0 g/m$^2$ or more, and more preferably within the range of 2.0 g/m$^2$ to 6.0 g/m$^2$. Less than 1 g/m$^2$ results in insufficient press life or easy development of scratches in non-image areas of the lithographic printing plates, which causes a tendency to form so-called "scratching stains" due to adhesion of ink to the scratches in printing.

Such anodic oxidation treatment is applied to a surface used for printing of the support of the lithographic printing plate. However, 0.01 g/m$^2$ to 3 g/m$^2$ of an anodic oxide film is also generally formed on the other side by back flowing of electric lines of force.

(Hydrophilization Treatment)

As hydrophilization treatment used after the above-mentioned treatment, hydrophilization treatment which has hitherto been known is used. Such hydrophilization treatment includes a alkali metal silicate (for example, an aqueous solution of sodium silicate) process as described in U.S. Pat. Nos. 2,714,066, 3,181,461, 3,280,734 and 3,902,734. In this process, the support is immersed or electrolyzed in the aqueous solution of sodium silicate. In addition, a process of treating the support with potassium fluorozirconate disclosed in JP-B-36-22063 (the term "JP-B" as used herein means an "examined Japanese patent publication"), or polyvinylphosphonic acid as disclosed in U.S. Pat. Nos. 3,276,868, 4,153,461 and 4,689,272 is used.

Of these, particularly preferred in the present invention is the silicate treatment.

The silicate treatment is described below.

(Silicate Treatment)

The anodic oxide films of the aluminum plates treated as described above are immersed in aqueous solutions containing 0.001% to 30% by weight, preferably 0.05% to 10% by weight of alkali metal silicates and having a pH of 9 to 13 at 25° C., for example, at 5° C. to 80° C. for 0.5 second to 120 seconds. If the pH of the aqueous solutions of alkali metal silicates is lower than 9, the solutions gel. On the other hand, exceeding 13.0 results in dissolution of the oxide films. The alkali metal silicates used in the present invention include sodium silicate, potassium silicate and lithium silicate. Hydroxides used for increasing the pH of the aqueous solutions of alkali metal silicates include sodium hydroxide, potassium hydroxide and lithium hydroxide. To the above-mentioned treating solutions, alkaline earth metal salts or salts of the group IVB metals may be added. The alkaline earth metal salts include water-soluble salts such as nitrates, for example, calcium nitrate, strontium nitrate, magnesium nitrate and barium nitrate, sulfates, hydrochlorides, phosphate, acetates, oxalates and borates. The salts of the group IVB metals include titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride. The alkaline earth metal salts or the salts of the group IVB metals can be used either alone or as a combination of two or more of them. The amount of these metal salts ranges preferably from 0.10% to 10% by weight, more preferably from 0.05% to 5.0% by weight.

The hydrophilicity of the aluminum plate surfaces is further improved by the silicate treatment by the silicate treatment, so that ink becomes hard to adhere to the non-image areas to improve the scumming prevention performance.

(Backcoats)

Backcoats are formed on the back sides of the supports as so required. Coating layers comprising organic polymers described in JP-A-5-45885 and metal oxides obtained by hydrolysis and polycondensation of organic or inorganic metal compounds or inorganic metal compounds described in JP-A-6-35174 are preferably used as such backcoats.

Of these coating layers, $Si(OCH_3)_4$, $Si(OC_2H_5)_4$, $Si(OC_3H_7)_4$ and $Si(OC_4H_9)_4$ are particularly preferred, because alkoxy compounds of silicon are inexpensive and easily available, and the coating layers of metal oxides given are excellent in resistance to development.

[2] Photosensitive Compositions

Photosensitive compositions used in the photosensitive lithographic printing plates are described in detail below.

As the photosensitive compositions used in the present invention, any compositions may be used as long as they change in the solubility or the swelling property in developing solutions before and after exposure.

Typical examples of the photosensitive compounds are described below, but the present invention is not limited thereby.

The photosensitive compounds of the photosensitive compositions include o-quinonediazido compounds, and typical examples thereof include o-naphthoquinonediazido compounds. The o-naphthoquinonediazido compounds are preferably esters of 1,2-diazonaphthoquinonesulfonyl chloride and pyrogallolacetone resins described in JP-B-43-28403.

Other suitable o-quinonediazido compounds are esters of 1,2-diazonaphthoquinonesulfonyl chloride and phenol-formaldehyde resins described in U.S. Pat. Nos. 3,046,120 and 3,188,210.

Other useful o-naphthoquinonediazido compounds are reported and known in a number of patents. They include, for example, compounds described in JP-A-47-5303, JP-A-48-63802, JP-A-48-63803, JP-A-48-96575, JP-A-49-38701, JP-A-48-13354, JP-B-37-18015, JP-B-41-11222, 45-9610, JP-B-49-17481, JP-A-5-11444, JP-A-5-19477, JP-A-5-19478, JP-A-5-107755, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

As still other o-quinonediazido compounds, o-naphthoquinonediazido compounds obtained by the reaction of polyhydroxy compounds having a molecular weight of 1,000 or less with 1,2-diazonaphthoquinonesulfonyl chloride can also be used. Examples thereof include compounds described in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, U.S. Pat. Nos. 3,102,809, 3,126,281, 3,130,047, 3,148,983, 3,184,310, 3,188,210 and 4,639,406.

When each of these o-naphthoquinonediazido compounds is synthesized, preferably 0.2 to 1.2 equivalents, more preferably 0.3 to 1.0 equivalent of 1,2-diazonaphthoquinone-sulfonyl chloride per hydroxyl group of the polyhydroxy compound is allowed to react. As 1,2-diazonaphthoquinone-sulfonyl chloride, 1,2-diazonaphthoquinone-5-sulfonyl chloride is preferred, but 1,2-diazonaphthoquinone-4-sulfonyl chloride can also be used. Although the resulting o-naphthoquinonediazido compound is a mixture of compounds variously different in the positions of 1,2-diazo-naphthoquinonesulfonate groups and the amount thereof introduced, the ratio of the compound in which hydroxyl groups are all converted to the 1,2-diazonaphthoquinone-sulfonate groups to this mixture (the content of the completely esterified compound) is preferably 5 mol % or more, and more preferably from 20 mol % to 99 mol %.

Without use of the o-naphthoquinonediazido compounds, for example, o-nitrylcarbinol ester group-containing polymers described in JP-B-52-2696, pyridinium group-containing compounds described in JP-A-4-365049, and diazonium group-containing compounds described in JP-A-5-249664, JP-A-6-83047, JP-A-6-324495 and JP-A-7-72621 can also be used as photosensitive compounds functioning as positive working compounds in the present invention. Further, combined systems of compounds producing acids by photolysis (JP-A-4-121748 and JP-A-4-365043) and compounds having C—O—C groups or C—O—Si groups dissociating with acids can also be used in the present invention. Examples thereof include combinations of the compounds producing acids by photolysis with acetal or O, N-acetal compounds (JP-A-48-89003), with orthoester or amidoacetal compounds (JP-A-51-120714), with polymers having acetal or ketal groups on their main chains (JP-A-53-133429), with enol ether compounds (JP-A-55-12995, JP-A-4-19748 and JP-A-6-230574), with N-acyliminocarbon compounds (JP-A-55-126236), with polymers having orthoester groups on their main chains (JP-A-56-17345), with polymers having silyl ester groups (JP-A-60-10247), and with silyl ether compounds (JP-A-60-37549, JP-A-60-121446, JP-A-63-236028, JP-A-63-236029 and JP-A-63-276046).

Furthermore, without use of the o-naphthoquinonediazido compounds, aromatic sulfone compounds and onium-containing compounds can also be used as photosensitive compounds functioning as positive working compounds in the present invention. In these cases, the compounds efficiently functions as positive working compounds by combination with compounds absorbing infrared to near infrared light to generate heat. As the compounds absorbing infrared to near infrared light to generate heat, compounds such as carbon black, cyanine dyes, methine dyes and naphtoquinone have been known. The amount of the compounds functioning as positive working compounds (including combinations as described above) contained in the photosensitive compositions of the present invention is suitably from 1% to 50% by weight, and more preferably from 10% to 40% by weight.

Of the above-mentioned compounds functioning as positive working compounds, particularly the o-quinonediazido compounds can even independently constitute the photosensitive layers. However, even when any of the photosensitive compounds are used, it is preferred that they are used in combination with alkaline water-soluble resins as binders. As such alkaline water-soluble resins, there are novolak resins having this property. Examples thereof include phenol-formaldehyde resins and cresol-formaldehyde resins such as m-cresol-formaldehyde resins, p-cresol-formaldehyde resins, mixed m-/p-cresol-formaldehyde resins and phenol/cresol (which may be any of m-, p-, o- and mixed m-/p-/o-) mixture-formaldehyde resins. These alkali-soluble polymers preferably have a weight-average molecular weight of 500 to 100,000.

In addition, resol type phenol resins are also suitably used, and phenol/cresol (which may be any of m-, p-, o- and mixed m-/p-/o-) mixture-formaldehyde resins are preferred. In particular, phenol resins described in JP-A-61-217034 are preferred.

Further, various alkali-soluble polymers such as phenol-modified xylene resins, polyhydroxystyrene, polyhydroxystyrene halide, acrylic resins containing phenolic hydroxyl groups as described in JP-A-51-34711, vinyl or urethane resins having sulfonamide groups described in JP-A-2-866 and vinyl resins having structure units described in JP-A-7-28244, JP-A-7-36184, JP-A-7-36185, JP-A-7-248628, JP-A-7-261394 and JP-A-7-333839 can be added. In particular, for the vinyl resins, film forming resins each having as a polymerization component at least one kind of monomer selected from alkali-soluble group-containing monomers of (1) to (4) shown below.

(1) Aromatic hydroxyl group-containing acrylamides, methacrylamides, acrylates, methacrylates and hydroxystyrenes such as N-(4-hydroxyphenyl)

acrylamide or N-(4-hydroxyphenyl)methacrylamide, o-, m- or p-hydroxystyrene, o- or m-bromo-p-hydroxystyrene, o- or m-chloro-p-hydroxystyrene and o-, m- or p-hydroxyphenyl acrylate or methacrylate;

(2) Unsaturated carboxylic acids such as acrylic acid, methacrylic acid, maleic acid, maleic anhydride and half esters thereof, and itaconic acid, itaconic anhydride and half esters thereof;

(3) Acrylamides such as N-(o-aminosulfonylphenyl) acrylamide, N-(m-aminosulfonylphenyl) acrylamide, N-(p-aminosulfonylphenyl)acrylamide, N-[1-(3-aminosulfonyl)naphthyl]acrylamide and N-(2-aminosulfonylethyl)acrylamide; methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide; and unsaturated sulfonamides of acrylates such as o-aminosulfonylphenyl acrylate, m-aminosulfonylphenyl acrylate, p-aminosulfonylphenyl acrylate, and 1-(3-aminosulfonylphenylnaphthyl) acrylate, and unsaturated sulfonamides of methacrylates such as o-aminosulfonylphenyl methacrylate, m-aminosulfonylphenyl methacrylate, p-aminosulfonylphenyl methacrylate, and 1-(3-aminosulfonylphenylnaphthyl) methacrylate; and (4) Phenylsulfonylacrylamides which may have substituent groups, such as tosylacrylamide, and phenylsulfonylmethacrylamides which may have substituent groups, such as tosylmethacrylamide.

In addition to these alkali-soluble group-containing monomers, film-forming resins in which monomers shown in the following (5) to (14) are copolymerized are preferably used.

(5) Acrylates and methacrylates having aliphatic hydroxyl groups, for example, 2-hydroxyethyl acrylate and 2-hydroxyethyl methacrylate;

(6) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(7) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(8) Acrylamides or methacrylamides such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(9) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(10) Vinyl esters such as vinyl acetate, vinyl chloroacetate, vinyl butyrate and vinyl benzoate;

(11) Styrenes such as a-methylstyrene, methylstyrene and chloromethylstyrene;

(12) Vinylketones such as methylvinylketone, ethylvinylketone, propylvinylketone and phenylvinylketone;

(13) Olefins such as ethylene, propylene, isobutylene, butadiene and isoprene; and

(14) N-Vinylpyrrolidone, N-vinylcarbazole, N-vinylpyridine, acrylonitrile and methacrylonitrile.

These alkali-soluble polymers preferably have a weight-average molecular weight of 500 to 500,000.

Such alkali-soluble polymers may be used either alone or as a combination of two or more of them, and are added in an amount of 99% by weight or less, preferably 98% by weight or less, based on the total composition.

Further, in the photosensitive lithographic printing plates which are never exposed to infrared to near infrared light, the amount of the above-mentioned alkali-soluble polymers added more preferably ranges from 30% by weight to 80% by weight, based on the total composition. The amount thereof within this range is preferred in development properties and press life.

Furthermore, with respect to an improvement in ink-receptivity of images, it is preferred that condensed products with phenol-formaldehyde resins having alkyl groups of 3 to 8 carbon atoms such as t-butylphenol-formaldehyde resins and octylphenol-formaldehyde resins, or o-naphthoquinoneazidosulfonates of these condensed products (for example, compounds described in JP-A-61-243446) are used in combination as described in U.S. Pat. No. 4,123,279.

(Development Accelerators)

For increasing sensitivity and improving development properties, it is preferred that cyclic acid anhydrides, phenols and organic acids are added to the photosensitive compositions in the present invention.

The cyclic acid anhydrides which can be used include phthalic anhydride, tetrahydrophthalic anhydride, hexahydrophthalic anhydride, 3,6-endoxo-$\Delta^4$-tetrahydrophthalic anhydride, tetrachlorophthalic anhydride, maleic anhydride, chloromaleic anhydride, a-phenylmaleic anhydride, succinic anhydride and pyromellitic anhydride described in U.S. Pat. No. 4,115,128.

The phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxy-triphenylmethane and 4,4',3",4"-tetrahydroxy-3,5,3',5'-tetramethyltriphenylmethane.

Further, as the organic acids, there are sulfonic acids, sulfinic acids, alkylsulfuric acids, phosphonic acids, phosphates and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid.

The above-mentioned cyclic acid anhydrides phenols and organic acids account for preferably 0.05% to 15% by weight, more preferably 0.1% to 5% by weight, of the photosensitive compositions.
(Development Stabilizers)

Further, for widening the stability of processing to development conditions (so-called development allowance), nonionic surfactants as described in JP-A-62-251740 and JP-A-4-68355, and amphoteric surfactants as described in JP-A-59-121044 and JP-A-4-13149 can be added to the photosensitive compositions used in the present invention.

Specific examples of the nonionic surfactants include sorbitan tristearate, sorbitan monopalmitate, sorbitan trioleate, stearic acid monoglyceride, polyoxyethylenesorbitan monooleate and polyoxyethylene nonyl phenyl ether.

Specific examples of the amphoteric surfactants include alkyldi(aminoethyl)glycines, alkylpolyaminoethylglycine chlorides, 2-alkyl-N-carboxylethyl-N-hydroxyethylimidazoliniumbetaines, N-tetradecyl-N,N-betaine type surfactants (for example, trade name: Amogen K manufactured by Dai-ichi Kogyo Seiyaku Co., Ltd.) and alkylimidazoline type surfactants (for example, trade name: Lebon 15 manufactured by Sanyo Chemical Industries, Ltd.)

The above-mentioned nonionic and amphoteric surfactants account for preferably 0.05% to 15% by weight, more preferably 0.1% to 5% by weight, of the photosensitive compositions.
(Printing-Out Agents, Dyes and Others)

Printing-out agents for obtaining visible images immediately after exposure, dyes as image colorants and other fillers can be added to the photosensitive compositions used in the present invention. The dyes which can be used in the present invention include basic dyes comprising salts of cations having basic dye skeletons and organic anions each having a sulfonic acid group as the only exchange group, 1 to 3 hydroxyl groups and 10 or more carbon atoms, described in JP-A-5-313359. The amount added is from 0.2% to 5% by weight based on the total photosensitive composition.

Compounds which interact with the dyes shown in JP-A-5-313359 described above to generate photolytic products changing color tones, for example, o-naphthoquinonediazido-4-sulfonyl halogenides described in JP-A-50-36209 (U.S. Pat. No. 3,969,118), trihalomethyl-2-pyrone and trihalomethyltriazine described in JP-A-53-36223 (U.S. Pat. No. 4,160,671), various o-naphthoquinonediazido compounds described in JP-A-55-62444 (U.S. Pat. No. 2,038,801) and 2-trihalomethyl-5-aryl-1,3,4-oxadiazole compounds described in JP-A-55-77742 (U.S. Pat. No. 4,279,982), can be added. These compounds can be used either alone or in combination. Of these compounds, compounds having absorption at 400 nm may be used as yellow dyes given later.

Besides the dyes shown in JP-A-5-313359 described above, other dyes can be used as the image colorants. Including salt-forming organic dyes, suitable dyes include oil-soluble dyes and basic dyes. Specific examples thereof include Oil Green BG, Oil Blue BOS, Oil Blue #603 (the above dyes are manufactured by Orient Kagaku Kogyo Co., Ltd.), Victoria Pure Blue BOH, Victoria Pure Blue NAPS, Ethyl Violet 6HNAPS (the above dyes are manufactured by Hodogaya Chemical Co., Ltd.), Rhodamine B (C145170B), Malachite Green (C142000) and Methylene Blue (C152015).

The following yellow dyes can be further added to the photosensitive compositions used in the present invention.

Yellow dyes represented by general formula (I), (II) or (III) in which the absorbance at 417 nm is 70% or more of an absorbance at 436 nm:

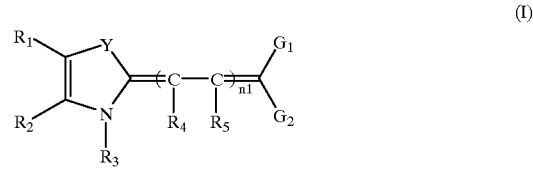

(I)

wherein $R_1$ and $R_2$ each independently represents a hydrogen atom, an alkyl group having 1 to 10 carbon atoms, an aryl group or an alkenyl group, and $R_1$ and $R_2$ may form a ring; $R_3$ $R_4$ and $R_5$ each independently represents a hydrogen atom or an alkyl group having 1 to 10 carbon atoms; $G_1$ and $G_2$ each independently represents an alkoxycarbonyl group, an aryloxycarbonyl group, an acyl group, an arylcarbonyl group, an alkylthio group, an arylthio group, an alkylsulfonyl group, an arylsulfonyl group or a fluoroalkylsulfonyl group, and $G_1$ and $G_2$ may form a ring; at least one of $R_1$, $R_2$, $R_3$, $R_4$, $R_5$, $G_1$ and $G_2$ has at least one sulfonic acid group, carboxyl group, sulfonamido group, imido group, N-sulfonylamido group, phenolic hydroxyl group, sulfonimido group, or metal salt thereof, or inorganic or organic ammonium salt; Y represents a divalent atomic group selected from O, S, NR (R is a hydrogen atom, an alkyl group or an aryl group), Se, —C(CH$_3$)$_2$— and —CH=CH—; and $n_1$ indicates 0 or 1.

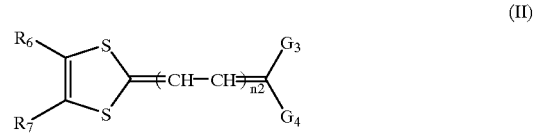

(II)

wherein $R_6$ and $R_7$ each independently represents a hydrogen atom, an alkyl group a substituted alkyl group, an aryl group, a substituted aryl group, a heterocyclic group, a substituted heterocyclic group, an allyl group or a substituted allyl group, and $R_6$ and $R_7$ may form a ring together with carbon atoms with which they combine; $n_2$ indicates 0, 1 or 2; $G_3$ and $G_4$ each independently represents a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluoroalkylsulfonyl group, with the proviso that $G_3$ and $G_4$ are not hydrogen atoms at the same time, and $G_3$ and $G_4$ may form a ring composed of non-metallic atoms together with carbon atoms with which they combine.

Further, at least one of $R_6$, $R_7$, $G_3$ and $G_4$ has at least one sulfonic acid group, carboxyl group, sulfonamido group, imido group, N-sulfonylamido group, phenolic hydroxyl group, sulfonimido group, or salt thereof, or inorganic or organic ammonium salt.

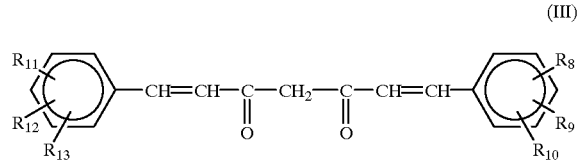

(III)

wherein $R_8$, $R_9$, $R_{10}$, $R_{11}$, $R_{12}$ and $R_{13}$, which may be the same or different, each represents a hydrogen atom, an alkyl group a substituted alkyl group, an aryl group, a substituted aryl group, an alkoxyl group, a hydroxyl group, an acyl group, a cyano group, an alkoxycarbonyl group, an aryloxycarbonyl group, a nitro group, a carboxyl group, a chloro group or a bromo group.

The photosensitive lithographic printing plates of the present invention are obtained by dissolving the above-mentioned respective photosensitive compositions in solvents and coating the supports with the resulting solutions.

As described above, the above-mentioned solvents are selected from solvents which do not dissolve the water-insoluble and alkali-soluble polymers contained in the intermediate layers used in the present invention. Specifically, such solvents can be suitably selected from, for example, y-butyrolactone, ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethyl sulfoxide, dimethylacetamide, dimethylformamide, water, N-methylpyrrolidone, tetrahydrofurfuryl alcohol, acetone, diacetone alcohol, methanol, ethanol, isopropanol, diethylene glycol dimethyl ether and mixtures thereof.

The concentration of the above-mentioned components (the solid content) is suitably from 2% to 50% by weight. The amount coated is preferably from 0.5 g/m$^2$ to 4.0 g/m$^2$. Less than 0.5 g/m$^2$ results in deteriorated press life, whereas exceeding 4.0 g/m$^2$ improves press life, but results in a reduction in sensitivity.

Surfactants for improving coating properties, for example, fluorine surfactants as described in JP-A-62-170950 can be added to the photosensitive compositions used in the present invention. The amount added is preferably from 0.01% to 1% by weight, and more preferably from 0.05% to 0.5% by weight, based on the total photosensitive composition. According to the lithographic printing plates obtained as described above, printed matter faithful to original image films can be obtained, but it has under cutting and damaged graininess of printed matter. For improving the under cutting, there is a method of making surfaces of the photosensitive layers thus provided uneven. For example, there is a method of adding particles having a size of several micron meters to a photosensitive coating solution, and applying the resulting solution, as described in JP-A-61-258255. According to this method, however, an effect of improving the under cutting is slight, and the graininess is not improved at all.

However, when a method of adhering unevenness-forming components to the surfaces of the photosensitive layers, as described in JP-A-50-125805, JP-B-57-6582, JP-B-61-28986 and JP-B-62-62337, is used, the under cutting is improved, and the graininess of printed matter is also made better. Further, when light absorbers having absorption within the photosensitive wavelength range of photosensitive materials are added to matte layers as described in JP-B-55-30619, the under cutting and graininess are further improved. Even when original image films having a line number of 300 lines or more per inch which is more liable to cause the under cutting and the damaged graininess of printed matter than original image films having a line number of 175 lines per inch, and original image films obtained by FM screening are used, good printed matter can be obtained. Minute patterns provided on the surfaces of the photosensitive layers of the photosensitive printing plates as described above are preferably as follows. That is to say, the height of coated areas is preferably from 1 μm to 40 μm, and particularly preferably from 2 μm to 20 μm, and the size (width) is preferably 10 μm to 10000 μm, and particularly preferably 20 μm to 200 μm. Further, the amount ranges from 1 projection/mm$^2$ to 1000 projections/mm$^2$, and preferably from 5 projections/mm$^2$ to 500 projections/mm$^2$.

[3] Development Processing

Development processing of the photosensitive lithographic printing plates of the present invention is described below.

(Exposure)

The photosensitive lithographic printing plates of the present invention are image exposed, followed by development processing. Light sources of active light rays used in image exposure include carbon arc lamps, mercury lamps, metal halide lamps, xenon lamps, tungsten lamps and chemical lamps. Radiations include electron beams, X-rays, ion beams and far infrared rays. Further, g-line, i-line, deep-UV rays and high density energy beams (laser beams) are also used. The laser beams include helium-neon laser beams, argon laser beams, krypton laser beams, helium-cadmium laser beams, KrF excimer laser beams, semiconductor laser beams and YAG laser beams.

(Developing Solutions)

Developing solutions for the photosensitive lithographic printing plates of the present invention are preferably alkaline aqueous solutions substantially free from organic solvents. Specifically, aqueous solutions of sodium silicate, potassium silicate, NaOH, KOH, LiOH, sodium tertiary phosphate, sodium secondary phosphate, ammonium tertiary phosphate, ammonium secondary phosphate, sodium metasilicate, sodium carbonate, sodium bicarbonate, potassium carbonate and aqueous ammonia are suitable. More preferably, a developing solution containing (a) at least one sugar selected from nonreducing sugars and (b) at least one base and having a pH ranging from 9.0 to 13.5 is used.

This developing solution is described in detail below. In this specification, the term "developing agent" means a development initiator (a developing solution in the narrow sense) and a development replenisher, unless otherwise specified.

(Nonreducing Sugars and Bases)

This developing solution is characterized by that it comprises at least one compound selected from nonreducing sugars and at least one base as its main components, and has a pH of 9.0 to 13.5.

Such nonreducing sugars are sugars having no free aldehyde and ketone groups and showing no reducing properties, and classified into trehalose type oligosaccharides in which reducing groups combine with each other, glycosides in which reducing groups of sugars combine with nonsugars, and sugar alcohols obtained by reduction of sugars by hydrogen addition. They are all suitably used. The trehalose type oligosaccharides include saccharose and trehalose, and the glycosides include alkyl glycosides, phenol glycosides and mustard oil glycosides. Further, the sugar alcohols include D, L-arabitol, adonite, xylitol, D, L-sorbitol, D, L-mannitol, D, L-iditol, D, L-talitol, dulcitol and allodulcitol. Furthermore, multitols obtained by hydrogen addition of disaccharides and reduced products (reduced starch syrup) obtained by hydrogen addition of oligosaccharides are suitably used. Of these, particularly preferred nonreducing sugars are sugar alcohols and saccharose, and particularly, D-sorbitol, saccharose and reduced starch syrup are preferred in terms of buffering action within an appropriate pH range and low cost.

These nonreducing sugars may be used either alone or as a combination of two or more of them, and account for preferably 0.1% to 30% by weight, more preferably 1% to 20% by weight, of the developing solutions. Less than this range results in failure to obtain sufficient buffering action, whereas exceeding this range leads to difficulty in highly concentrating them, and introduces the problem of increasing costs. Further, if reducing sugars are used in combination with bases, this introduces the problems of changing color to brown with the lapse of time, reducing a pH gradually, and deteriorating the development properties.

As the bases combined with the nonreducing sugars, conventionally known alkali agents can be used. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanol-amine, monoisopropanolamine, diisopropanolamine, ethyleneimine, ethylenediamine and pyridine are also used.

These alkali agents are used either alone or as a combination of two or more of them. Of these, sodium hydroxide and potassium hydroxide are preferred. The reason for this is that the pH adjustment becomes possible in a wide pH region by adjustment of the amount of them to the nonreducing sugars. Further, trisodium phosphate, tripotassium phosphate, sodium carbonate and potassium carbonate are preferred because they themselves have buffering action.

These alkali agents are added so that the developing solutions have a pH ranging from 9.0 to 13.5, and the amount thereof added is determined according to the desired pH, and the kind and amount added of nonreducing sugar. However, the pH range is more preferably from 10.0 to 13.2.

Further, in the developing solutions, weak acids other than the sugars can be used in combination with alkali buffer solutions comprising strong bases.

As the weak acids used as such buffer solutions, acids having a pKa of 10.0 to 13.2 are preferred. Such weak acids are selected from ones described in *Ionization Constants of Organic Acids in Aqueous Solution* published by Pergamon Press, and include, for example, alcohols such as 2,2,3,3-tetrafluoropropanol-1 (pKa 12.74), trifluoroethanol (pKa 12.37) and trichloroethanol (pKa 12.24), aldehydes such as pyridine-2-aldehyde (pKa 12.68) and pyridine-4-aldehyde (pKa 12.05), phenolic hydroxyl group-containing compounds such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), o-cresol (pKa 10.33), resorcinol (pKa 11.27), p-cresol (pKa 10.27) and m-cresol (pKa 10.09), oximes such as 2-butanone oxime (pKa 12.45), acetoxime (pKa 12.42), 2-cycloheptanedione dioxime (pKa 12.3), 2-hydroxybenzaldehyde oxime (pKa 12.10), dimethylglyoxime (pKa 11.9), ethanediamidodioxime (pKa 11.37) and acetophenone oxime (pKa 11.35), and nucleic acid-relating substances such as adenosine (pKa 12.56), inosine (pKa 12.5), guanine (pKa 12.3), cytosine (pKa 12.2), hypoxanthine (pKa 12.1) and xanthine (pKa 11. 9). In addition, they further include weak acids such as diethylaminomethylphosphonic acid (pKa 12.32), 1-amino-3,3,3-trifluorobenzoic acid (pKa 12.29), isopropylidenediphosphonic acid (pKa 12.10), 1,1-ethylidenediphosphonic acid (pKa 11.54), 1,1-ethylidenediphosphonic acid 1-hydroxy (pKa 11.52), benzimidazole (pKa 12.86), thiobenzamide (pKa 12.8), picolinethioamide (pKa 12.55) and barbituric acid (pKa 12.5).

Of these weak acids, preferred are salicylic acid and sulfosalicylic acid.

As the bases combined with these weak acids, sodium hydroxide, ammonium hydroxide, potassium hydroxide and lithium hydroxide are suitably used.

These alkali agents are used either alone or as a combination of two or more of them.

The above-mentioned various alkali agents are used after adjustment of the pH within a preferred range by the concentration and combination thereof.

(Surfactants)

For accelerating the development properties, and enhancing dispersion of development scum and the ink affinity of image areas of the printing plates, various surfactants and organic solvents can be added as required. Preferred examples of the surfactants include anionic, cationic, nonionic and amphoteric surfactants.

Preferred examples of the surfactants include nonionic surfactants such as polyoxyethylene alkyl ethers, polyoxyethylene alkyl phenyl ethers, polyoxyethylene polystyryl phenyl ethers, polyoxyethylene polyoxypropylene alkyl ethers, glycerol fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylene caster oils, polyoxyethylene glycerol fatty acid partial esters, fatty acid diethanolamides, N,N-bis-hydroxyalkylamines, polyoxyethylenealkylamines, triethanolamine fatty acid esters and trialkylamine oxides, anionic surfactants such as fatty acid salts, abietates, hydroxyalkanesulfonates, alkanesulfonates, dialkylsulfosuccinic acid ester salts, straight-chain alkylbenzenesulfonates, branched chain alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salt, N-alkylsulfosuccinic acid monoamide disodium salts, petroleum sulfonic acid salts, sulfated tallow, fatty acid alkyl ester sulfates, alkylsulfates, polyoxyethylene alkyl ether sulfates, fatty acid monoglyceride sulfates, polyoxyethylene alkyl phenyl ether sulfates, polyoxyethylene styryl phenyl ether sulfates, alkyl phosphates, polyoxyethylene alkyl ether phosphates, polyoxyethylene alkyl phenyl ether phosphates, partially saponified products of styrene/maleic anhydride copolymers, partially saponified products of olefin/maleic anhydride copolymers and formalin-condensed products of naphthalenesulfonates, cationic surfactants such as alkylamine salts, quaternary ammonium salts such as tetrabutylammonium bromide, polyoxyethylenealkylamine salts and polyethylenepolyamine derivatives, and amphoteric surfactants such as carboxybetaines, aminocarboxylic acids, sulfobetaines, aminosulfates and imidazolines.

In the surfactants described above, "polyoxyethylene" can also be read as a polyoxyalkylene such as polyoxymethylene, polyoxypropylene or polyoxybutylene, and such surfactants are also included.

Further preferred surfactants are fluorine surfactants having perfluoroalkyl groups in their molecules. Such fluorine surfactants include anionic surfactants such as perfluoroalkylcarboxylates, perfluoroalkylsulfonates and perfluoroalkylphosphates, amphoteric surfactants such as perfluoroalkylbetaines, cationic surfactants such as perfluoroalkyltrimethylammonium salts, and nonionic surfactants such as perfluoroalkylamine oxides, perfluoroalkyl ethylene oxide adducts, oligomers containing perfluoroalkyl groups and lipophilic groups, oligomers containing perfluoroalkyl groups, hydrophilic groups and lipophilic groups, and urethanes containing perfluoroalkyl groups and lipophilic groups.

The above-mentioned surfactants can be used either alone or as a combination of two or more of them, and are added to the developing agents within the range of 0.001% to 10% by weight, more preferably within the range of 0.01% to 5% by weight.

(Development Stabilizers)

Various development stabilizers are used in the developing solutions. Preferred examples thereof include polyethylene glycol adducts of sugar alcohols described in JP-A-6-282079, tetraalkylammonium salts such as tetrabutylammonium hydroxide, phosphonium salts such as tetrabutylphosphonium bromide, and iodonium salts such as diphenyliodonium chloride.

They further include anionic surfactants or amphoteric surfactants described in JP-A-50-51324, water-soluble cationic polymers described in JP-A-55-95946 and water-soluble amphoteric polyelectrolytes described in JP-A-56-142528.

Furthermore, they include alkylene glycol-added organic boron compounds described in JP-A-59-84241, polyoxyethylene-polyoxypropylene block copolymerization type water-soluble surfactants described in JP-A-60-111246, polyoxyethylene-polyoxypropylene-substituted alkylenediamine compounds described in JP-A-60-129750, polyethylene glycol having a weight-average molecular weight of 300 or more described in JP-A-61-215554, fluorine-containing surfactants having cationic groups described in JP-A-63-175858, water-soluble ethylene oxide addition compounds obtained by adding 4 moles or more of ethylene oxide to acids or alcohols in JP-A-2-39157, and water-soluble polyalkylene compounds.

(Organic Solvents)

The developing solutions used in the present invention are substantially free from organic solvents. However, organic solvents are added thereto if necessary. Such organic solvents suitably have a solubility in water of about 10% by weight or less, and are preferably selected from ones having a solubility of 5% by weight or less. Examples thereof include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxy-benzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanol-amine and N-phenyldiethanolamine. In the developing solutions used in the present invention, "substantially free from organic solvents" means that the content of the organic solvents is 5% by weight or less based on the total weight of the solutions used. The amount thereof used is closely related to the amount of the surfactants used, and it is preferred that the amount of the surfactants is increased with an increase in the amount of the organic solvents. This is because if the surfactants are used in small amounts and the organic solvents are used in large amounts, the organic solvents are not completely dissolved, resulting in failure to expect to ensure good development properties.

(Reducing Agents)

Reducing agents can be further added to the developing agents, which prevents the printing plates from being stained. In particular, this is effective in developing negative working photosensitive lithographic printing plates containing photosensitive diazonium salt compounds. Preferred examples of the organic reducing agents include phenol compounds such as thiosalicylic acid, hydroquinone, Metol, methoxyquinone, resorcin and 2-methylresorcin, and amine compounds such as phenylenediamine and phenylhydrazine. Further preferred examples of the inorganic reducing agents include sodium salts, potassium salts and ammonium salts of inorganic acids such as sulfurous acid, hydrogensulfurous acid, phosphorous acid, hydrogenphosphorous acid, dihydrogenphosphorous acid, thiosulfuric acid and dithionous acid. Of these reducing agents, particularly excellent in scumming prevention effect are sulfites. These reducing agents are preferably contained within the range of 0.05% to 5% by weight based on the developing solutions at the time of use.

(Organic Carboxylic Acids)

Organic carboxylic acids can be further added to the developing solutions. The organic carboxylic acids are preferably aliphatic and aromatic carboxylic acids having 6 to 20 carbon atoms. Specific examples of the aliphatic carboxylic acids include caproic acid, enanthylic acid, caprylic acid, lauric acid, myristic acid, palmitic acid and stearic acid, and particularly, alkanoic acids each having 8 to 12 carbon atoms are preferred. Further, they may be unsaturated fatty acids having either double bonds in carbon chains or branched carbon chains.

The aromatic carboxylic acids are compounds in which benzene rings, naphthalene rings and anthracene rings have carboxyl groups as substituent groups, and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid. The hydroxynaphthoic acids are particularly effective.

The above-mentioned aliphatic and aromatic carboxylic acids are preferably used as sodium salts, potassium salts or ammonium salts for enhancing water solubility. There is no particular limitation on the content of the organic carboxylic acids in the developing solutions used in the present invention. However, less than 0.1% by weight results in insufficient effect, whereas exceeding 10% by weight not only results in failure to more improve the effect, but also sometimes prevents other additives from being dissolved when they are used in combination. Accordingly, the amount added is preferably 0.1% to 10% by weight, and more preferably 0.5% to 4% by weight, based on the developing solutions at the time of use.

(Others)

The developing solutions can also further contain preservatives, colorants, thickeners, antifoaming agents and hard water softeners as required. Examples of the hard water softeners include polyphosphoric acids, and sodium salts, potassium salts and ammonium salts thereof; aminopolycarboxylic acids such as ethylenediaminetetraacetic acid, diethylenetriaminepentaacetic acid, triethylenetetraminehexaacetic acid, hydroxyethylethylenediaminetriacetic acid, nitriloacetic acid, 1,2-diaminocyclohexanetetraacetic acid and 1,3-diamino-2-propanoltetraacetic acid, and sodium salts, potassium salts and ammonium salts thereof; and aminotri(methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid) and 1-hydroxyethane-1,1-diphosphonic acid, and sodium salts, potassium salts and ammonium salts thereof.

Although the optimum value of such hard water softeners varies according to their chelating power, the hardness of hard water used and the amount of hard water, the usual amount thereof used ranges from 0.01% to 5% by weight, and more preferably from 0.01% to 0.5% by weight, based on the developing solutions at the time of use. If the amount added is less than this range, the desired objects are not sufficiently attained. On the other hand, if the amount added is more than this range, adverse effect is exerted on image areas such as blank color areas.

The residual component of the developing solution is water. In respect to transportation, it is advantageous to dilute a concentrated solution whose water content is less than that at the time of use, with water at the time of use. For the concentrated degree in this case, such a degree that the respective components are not separated or precipitated is appropriate.

As the developing solution for the photosensitive lithographic printing plate of the present invention, a developing solution described in JP-A-6-282079 can also be used. This developing solution is a developing solution containing a water-soluble ethylene oxide addition compound obtained by adding 5 moles or more of ethylene oxide to an alkali metal silicate having a $SiO_2/M_2O$ (wherein M represents an alkali metal) molar ratio of 0.5 to 2.0 and a sugar alcohol having 4 or more hydroxyl groups. The sugar alcohols are polyhydric alcohols corresponding to sugars in which aldehyde groups and ketone groups are converted to first and second alcohol groups, respectively. Specific examples of the sugar alcohols include D, L-threitol, erythritol, D, L-arabitol, adonite, xylitol, D, L-sorbitol, D, L-mannitol, D, L-iditol, D, L-talitol, dulcitol and allodulcitol, and further include di, tri, tetra, penta and hexaglycerols obtained by condensation of the sugar alcohols. The above-mentioned water-soluble ethylene oxide addition compound is obtained by adding 5 moles or more of ethylene oxide to 1 mole of the above-mentioned sugar alcohol. Further, propylene oxide may be block copolymerized with the ethylene oxide addition compound as required, as long as the solubility is allowable. These ethylene oxide addition compounds may be used either alone or as a combination of two or more of them.

The amount of these water-soluble ethylene oxide addition compounds added is suitably from 0.001% to 5% by weight, and more preferably from 0.001% to 2% by weight, based on the developing solutions (working solutions).

For accelerating the development properties, and enhancing dispersion of development scum and the ink affinity of image areas of the printing plates, the above-mentioned various surfactants and organic solvents can be added as required.

(Development and After Treatment)

The PS plates processed with the developing solutions having such composition are after treated with washing water, rinsing solutions containing surfactants, finishers mainly composed of gum arabic and starch derivatives, and protective gum solutions. For the after treatment of the PS plates of the present invention, these treatments can be used in various combinations.

Recently, in the prepress processing andprinting industries, automatic processors for PS plates have been widely used for rationalization and standardization of prepress processing operations. This automatic processor generally comprises a development unit, an after treatment unit, a device for transporting a PS plate, respective processing solution tanks and sprays, and respective pumped-up processing solutions are sprayed on the exposed PS plate from spray nozzles while horizontally transporting the PS plates to conduct development and after treatment. Further, recently, a process of immersing and transporting a PS plate in a processing tank filled with a processing solution by means of guide rolls provided in the solution to conduct development processing, and a process of supplying a small constant amount of washing water to a plate surface after development to wash it with water, and recycling the waste water as diluent water for a stock solution of a developing solution have also been known.

In such automatic processing, processing can be performed while replenishing each replenisher to each processing solution depending on the processing amount and operating time. Further, a so-called throw-away processing system in which a plate is processed with a substantially virgin processing solution can also be applied.

The lithographic printing plates obtained by such processing are set on an offset press to print a number of sheets.

The present invention will be described with reference to examples in detail below. All percentages in the following examples are by weight, unless otherwise specified.

EXAMPLES 1 TO 6 AND COMPARATIVE EXAMPLES 1 TO 3

A surface of a 0.24-mm thick JIS A1050 aluminum plate was grained by use of a nylon brush and an aqueous suspension of 400-mesh pumice powder, and then, well washed with water. The plate was immersed in a 10% aqueous solution of sodium hydroxide at 70° C. for 60 seconds to conduct etching, washed with running water, neutralized and washed with a 20% aqueous solution of nitric acid, and washed with water. This was electrolytically surface roughened using alternating waveform current of a sine wave under the conditions of VA=12.7 V in a 1% aqueous solution of nitric acid at a quantity of anode electricity of 260 coulombs/dm$^2$. The measurement of the surface roughness showed 0.55 μm (Ra indication). Subsequently, it was immersed in a 30% aqueous solution of sulfuric acid, and desmutted at 55° C. for 2 minutes. Then, anodic oxidation was carried out in a 20% aqueous solution of sulfuric acid at a current density of 14 A/dm$^2$ so as to give an anodic oxide film amount of 2.5 g/m$^2$, followed by washing with water to prepare substrate [A].

Substrate [A] was treated with a 0.15 wt % aqueous solution of sodium silicate at 22° C. for 10 seconds, and washed with water topreparesubstrate[B]. Further, substrate [A] was treated with a 2.5 wt % aqueous solution of sodium silicate at 30° C. for 10 seconds, and washed with water to prepare substrate [C]. Furthermore, substrate [A] was treated with a 2.5 wt % aqueous solution of sodium silicate at 50° C. for 5 seconds, and washed with water to prepare substrate [D]. As hydrophilization treatment other than the use of sodium silicate, substrate [A] was treated with a 1% aqueous solution of saponin at 40° C. for 30 seconds, and washed with water to prepare substrate [E]. Similarly, substrate [A] was treated with a 1% aqueous solution of Glucopon at 70° C. for 30 seconds, and washed with water to prepare substrate [F].

Surfaces of substrates [A] to [F] thus treated were coated with the following coating solutions prepared by mixing the polymers discovered in the present invention or compounds for comparison (a) shown in Table 1 with optionally additives (b) consisting of compounds represented by general formula (6) shown in Table 1, and dried at 100° C. for 10 seconds.

Polymers of Invention or Compounds for Comparison (a)
(shown in Table 1 as dried amount coated)
Additives shown in Table 1 (b)
(shown in Table 1 as dried amount coated)
Methanol 100 g
Water 1.0 g The structure and number-average molecular weight of the compounds for comparison were as follows:

| Compounds for Comparison | | |
|---|---|---|
| | Structure | Number-average molecular weight (Mn) |
| No. 1 | —(CH$_2$CH)$_{80}$— —(CH$_2$CH)$_{20}$— <br> \| \| <br> C$_6$H$_4$ C$_6$H$_4$ <br> \| \| <br> COOH CH$_2$N$^+$(n-Bu)$_3$ Cl$^-$ | 200,000 |
| No. 2 | —(CH$_2$CH)$_{95}$— —(CH$_2$CH)$_5$— <br> \| \| <br> C$_6$H$_4$ C$_6$H$_5$ <br> \| <br> COOH | 630,000 |

Then, a photosensitive layer was formed on this substrate by coating it with photosensitive solution [A], [B] or [C]. The amount of photosensitive layer coated after drying was 1.2 g/m$^2$ for photosensitive solution [A], and 1.7 g/m$^2$ for photosensitive solutions [B] and [C]. Further, for decreasing the vacuum adhesion time in exposure, a matte layer was formed by the method described in JP-B-61-28986, thereby preparing a photosensitive lithographic printing plate.

| [Photosensitive Solution A] | |
|---|---|
| Esterified Product of 1,2-Diazonaphthoquinone-5-sulfonyl Chloride and Pyrogallol-Acetone Resin (described in Example 1 of U.S. Pat. No. 3,635,709) | 0.8 g |
| Cresol-Formaldehyde Novolak Resin (m:p ratio 6:4, weight-average molecular weight 8000) | 1.2 g |
| Phenol-Formaldehyde Novolak Resin (weight average molecular weight 10000) | 0.3 g |
| Resins Other Than Novolak | 0.7 g |

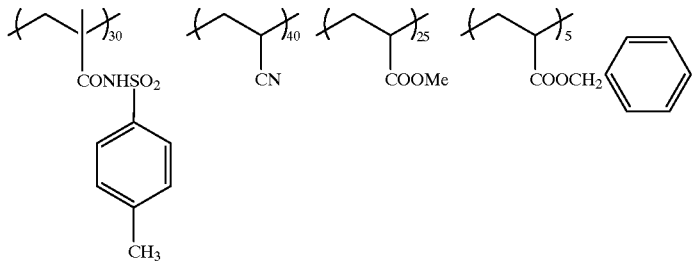

| Naphthoquinone-1,2-diazido-4-sulfonyl Chloride | 0.1 g |
|---|---|
| Tetrahydroxyphthalic Anhydride | 0.2 g |
| Pyrogallol | 0.05 g |
| Benzoic Acid | 0.02 g |
| 4-[p-N,N-Bis(ethoxycarbonylmethyl)aminophenyl]-2,6-bis(trichloromethyl)-s-triazine (hereinafter referred to as triazine A for brevity) | 0.1 g |
| Victoria Pure Blue BOH (manufactured by Hodogaya Chemical Co., Ltd., a dye in which counter anion was changed to 1-naphthalenesulfonic acid) | 0.1 g |
| F-177 (fluorine surfactant manufactured by Dainippon Ink & Chemicals, Inc.) | 0.2 g |

-continued

| | |
|---|---|
| Methyl Ethyl Ketone | 30 g |
| 1-Methoxy-2-propanol | 15 g |
| [Photosensitive Solution B] | |
| | |
| Esterified Product of 1,2-Diazonaphthoquinone-5-sulfonyl Chloride and Pyrogallol-Acetone Resin (described in Example 1 of U.S. Pat. No. 3,635,709) | 0.9 g |
| Cresol-Formaldehyde Novolak Resin (m:p ratio 6:4, weight-average molecular weight 3000) | 2.2 g |
| p-Normaloctylphenol-Formaldehyde Resin (described in U.S. Pat. No. 4,123,279) | 0.02 g |
| Naphthoquinone-1,2-diazido-4-sulfonyl Chloride | 0.03 g |
| Tetrahydroxyphthalic Anhydride | 0.2 g |
| Pyrogallol | 0.05 g |
| Benzoic Acid | 0.02 g |
| Triazine A | 0.1 g |
| Victoria Pure Blue BOH (manufactured by Hodogaya Chemical Co., Ltd., a dye in which counter anion was changed to 1-naphthalenesulfonic acid) | 0.05 g |
| F-176 PF (fluorine surfactant manufactured by Dainippon Ink & Chemicals, Inc.) | 0.05 g |
| Methyl Ethyl Ketone | 25 g |
| 1-Methoxy-2-propanol | 1.0 g |
| Water | 0.5 g |
| [Photosensitive Solution C] | |
| | |
| Esterified Product of 1,2-Diazonaphthoquinone-5-sulfonyl Chloride and 2,3,4-Trihydroxybenzophenone (esterification rate 90%) | 0.6 g |
| N-(p-Aminosulfonylphenyl)methacrylamide/Acrylonitrile/Methyl Methacrylate Copolymer (molar ratio 45/30/25, weight-average molecular weight 75000) | 1.7 g |
| Cresol-Formaldehyde Novolak Resin (m:p ratio 6:4, weight-average molecular weight 3000) | 0.7 g |
| Tetrahydroxyphthalic Anhydride | 0.1 g |
| Triazine A | 0.1 g |
| Victoria Pure Blue BOH (manufactured by Hodogaya Chemical Co., Ltd., a dye in which counter anion was changed to 1-naphthalenesulfonic acid) | 0.05 g |
| F-176 PF (fluorine surfactant manufactured by Dainippon Ink & Chemicals, Inc.) | 0.05 g |
| γ-Butyrolactone | 8.0 g |
| Methyl Ethyl Ketone | 12.0 g |
| 1-Methoxy-2-propanol | 10.0 g |

The photosensitive lithographic printing plates thus prepared were exposed to a 3-kW metal halide lamp 1 m apart for 1 minute, and developed with the following developing solutions by use of an automatic processor (PS Processor 900VR manufactured by Fuji Photo Film Co., Ltd.) at 30° C. for 12 seconds.

| | |
|---|---|
| Developing solution A: | |
| | |
| D-Sorbitol | 5.1 parts by weight |
| Sodium Hydroxide | 1.1 parts by weight |
| Triethanolamine-Ethylene Oxide Adduct (30 moles) | 0.03 part by weight |
| Water | 93.8 parts |
| Developing solution B: | |
| | |
| Aqueous Solution of Sodium Silicate (SiO$_2$/Na$_2$O molar ratio 1:2, SiO$_2$ 1.4% by weight) | 100 parts |
| Ethylenediamine-Ethylene Oxide Adduct (30 moles) | 0.03 part |

After such development processing, the following characteristics were evaluated.

(1) Press Life

When printing was performed using a LITHRONE printing machine manufactured by Komori Insatsuki Co., Ltd., it was evaluated how many sheets could be normally printed. The larger number of the normally printed sheets shows better press life.

(2) Deletion Performance

An image having an image area of 2 cm$^2$ was deleted with a paintbrush using an RP-3 deletion fluid manufactured by Fuji Photo Film Co., Ltd., and it was evaluated how the image was deleted.

A . . . The image was deleted very rapidly.
B . . . The image was deleted somewhat slowly.
C . . . The image was deleted very slowly.
D . . . The image was deleted extremely slowly.

(3) Photosensitive Layer Removability

The removability of a photosensitive layer binder of a non-image area of a printing plate developed was evaluated as follows:

A . . . The photosensitive layer binder of the non-image area was clearly removed.
B . . . The photosensitive layer binder slightly remained on the non-image area.
C . . . The photosensitive layer binder remained on the non-image area.

The amount of the remaining photosensitive layer binder was measured with a reflection type ultra violet-visible absorptiometer. The larger the remaining amount is, the more largely the absorption of the binder is observed.

(4) Image Reproducibility,

When the line width of an image printed on the 2,000th printed matter is compared with that of the same image printed on the 20,000th printed matter, a smaller change in line width shows better image reproducibility.

A . . . No change in line width was observed at all.
B . . . A change in line width was slightly observed.
C . . . A change in line width was observed.

Results are shown in Table 1. The results shown in Table 1 reveals that the photosensitive lithographic printing plates of the present invention are significantly excellent in press life, deletion performance, photosensitive layer removability and image reproducibility by using the water-insoluble, alkali-soluble polymers of the present invention in the intermediate layers.

TABLE 1

| | | Intermediate Layer | | | | Photosensi- | | Results of Evaluation | | | |
| | | Polymer (a) | | | | tive Layer | | Press | | Photosensi- | |
| | | Used in | Additive (b) | | | Photo- | Development | Life | | tive Layer | Image |
| | Sub- | Intermediate Layer (Embod- | used in Intermediate | Amount Coated | | sensitive | Developing | (10000 | Deletion | Remov- | Repro- |
| | strate | iment No.) | Layer | (a) | (b) | Solution | Solution | sheets) | Property | ability | ducibility |
|---|---|---|---|---|---|---|---|---|---|---|---|
| Example 1 | B | No. 1 | Salicylic acid | 5.0 | 0.5 | A | A | 17.5 | A | A | A |
| Example 2 | B | No. 2 | Salicylic acid | 6.0 | 1.0 | A | B | 17.0 | A | A | A |
| Example 3 | C | No. 1 | 3-Hydroxy-benzoic acid | 15.0 | 3.0 | B | A | 16.0 | A | A | A |
| Example 4 | D | No. 3 | 2,4-Dihydroxy-benzoic acid | 12.0 | 1.5 | C | B | 16.5 | A | A | A |
| Example 5 | E | No. 3 | Not added | 20.0 | — | B | A | 16.5 | A | A | A |
| Example 6 | F | No. 4 | 2-Hydroxy-3-naphthoic acid | 7.0 | 1.5 | C | B | 17.0 | A | A | A |
| Example 7 | B | No. 1 | Salicylic acid | 15.0 | 2.0 | D | A | 17.0 | A | A | A |
| Example 8 | C | No. 2 | Not added | 2.0 | — | D | B | 18.0 | A | A | A |
| Example 9 | C | No. 1 | 1-Hydroxy-2-naphthoic acid | 7.5 | 2.5 | E | A | 17.5 | A | A | A |
| Example 10 | G | No. 2 | Salicylic acid | 11.0 | 4.5 | E | B | 17.0 | A | A | A |
| Example 11 | B | No. 24 | Not added | 18.0 | — | B | A | 15.0 | A | A | A |
| Example 12 | D | No. 24 | 4-Hydroxy-benzoic acid | 10.0 | 1.0 | D | B | 14.5 | A | A | A |
| Comparative Example 1 | A | No. 1 | Salicylic acid | 6.0 | 1.5 | A | A | 15.0 | D | C | B |
| Comparative Example 2 | B | Not added | Salicylic acid | — | 2.0 | A | A | 3.0 | A | A | C |
| Comparative Example 3 | B | Compound for comparison No. 1 | 3-Hydroxy-benzoic acid | 5.0 | 0.8 | A | A | 16.5 | C | B | B |
| Comparative Example 4 | C | Compound for comparison No. 2 | Not added | 5.5 | — | B | A | 15.5 | C | C | B |
| Comparative Example 5 | B | Compound for comparison No. 1 | Not added | 15.0 | — | D | A | 13.0 | B | B | B |
| Comparative Example 6 | C | Compound for comparison No. 2 | 2,4-Dihydroxy-benzoic acid | 9.0 | 3.0 | E | A | 14.5 | C | B | B |

The present invention will be further described with reference to examples using different photosensitive solutions in detail below.

EXAMPLES 7 TO 12 AND COMPARATIVE EXAMPLES 4 TO 6

In addition to substrates [A] to [F], substrate [A] was immersed in a 1% aqueous solution of rutin trihydrate at 50° C. for 30 seconds, and washed with water to prepare substrate [G].

Surfaces of substrates [A] to [D] and [G] thus treated were coated with the following coating solutions prepared by mixing the polymers discovered in the present invention or compounds for comparison (a) shown in Table 1 with optionally additives (b) consisting of compounds represented by general formula (6) shown in Table 1, and dried at 100° C. for 10 seconds.

Polymers of Invention or Compounds for Comparison (a) (shown in Table 1 as dried amount coated)

Additives shown in Table 1 (b) (shown in Table 1 as dried amount coated)

Methanol 100 g

Water 1.0 g

Then, a photosensitive layer was formed on this substrate by coating it with photosensitive solution [D] or [E]. The amount of photosensitive layer coated after drying was 1.8 g/m².

| [Photosensitive Solution D] | |
|---|---:|
| Cresol-Formaldehyde Novolak Resin (m:p ratio 6:4, weight-average molecular weight 8000) | 0.4 g |
| Phenol-Formaldehyde Novolak Resin (weight average molecular weight 10000) | 0.1 g |
| N-(p-Aminosulfonylphenyl)methacrylamide/Acrylonitrile/Methyl Methacrylate Copolymer (molar ratio 45/30/25, weight-average molecular weight 75000) | 1.4 g |
| p-Toluenesulfonic Acid | 0.01 g |
| Tetrahydroxyphthalic Anhydride | 0.08 g |
| Diphenyl Sulfone | 0.3 g |
| Cyanine Dye A | 0.04 g |

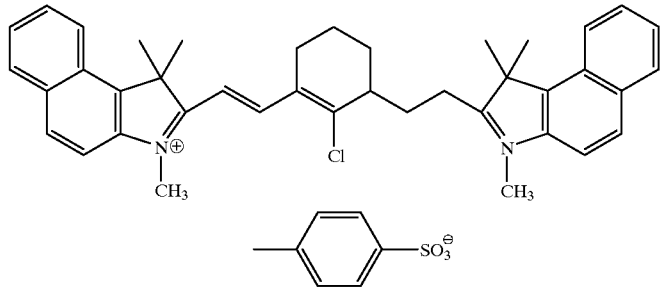

| | |
|---|---:|
| Victoria Pure Blue BOH (manufactured by Hodogaya Chemical Co., Ltd., a dye in which counter anion was changed to 1-naphthalenesulfonic acid) | 0.02 g |
| F-176 PF (fluorine surfactant manufactured by Dainippon Ink & Chemicals, Inc.) | 0.05 g |
| γ-Butyrolactone | 8 g |
| Methyl Ethyl Ketone | 12 g |
| 1-Methoxy-2-propanol | 10 g |
| [Photosensitive Solution E] | |
| Cresol-Formaldehyde Novolak Resin (m:p ratio 6:4, weight-average molecular weight 3000) | 0.9 g |
| N-(p-Aminosulfonylphenyl)methacrylamide/Acrylonitrile/Methyl Methacrylate Copolymer (molar ratio 45/30/25, weight-average molecular weight 75000) | 0.9 g |
| p-Toluenesulfonic Acid | 0.02 g |
| n-Dodecyl Stearate | 0.05 g |
| Maleic Anhydride | 0.1 g |
| Dimethyl Sulfone | 0.5 g |
| Cyanine Dye A | 0.04 g |
| Victoria Pure Blue BOH (manufactured by Hodogaya Chemical Co., Ltd., a dye in which counter anion was changed to 1-naphthalenesulfonic acid) | 0.04 g |
| F-177 (fluorine surfactant manufactured by Dainippon Ink & Chemicals, Inc.) | 0.03 g |
| γ-Butyrolactone | 8 g |
| Methyl Ethyl Ketone | 12 g |
| 1-Methoxy-2-propanol | 10 g |

The photosensitive lithographic printing plates thus prepared were exposed at a main scanning speed of 5 m/second using a semiconductor laser having an output of 500 mW, a wavelength of 830 nm and a beam diameter of 17 μm (1/e$^2$), and developed with developing solutions A and B used in Examples 1 to 6 by use of an automatic processor (PS Processor 900VR manufactured by Fuji Photo Film Co., Ltd.) at 30° C. for 12 seconds.

After such development processing, (1) press life, (2) deletion performance, (3) photosensitive layer removability and (4) image reproducibility were evaluated in the same manner as with Examples 1 to 6.

Results are shown in Table 1. The results shown in Table 1 reveals that the photosensitive lithographic printing plates of the present invention are significantly excellent in press life, deletion performance, photosensitive layer removability and image reproducibility by using the water-insoluble, alkali-soluble polymers of the present invention in the intermediate layers.

According to the present invention, the photosensitive lithographic printing plates excellent in deletion performance, image reproducibility and photosensitive layer removability can be provided while retaining press life.

Further, according to the present invention, the photosensitive lithographic printing plates have good press life, deletion performance, image reproducibility and photosensitive layer removability, even when they are developed using developing solutions containing no silicates. Accordingly, they have extremely high practicability.

What is claimed is:

1. A photosensitive lithographic printing plate comprising an aluminum support hydrophilized after anodic oxidation, an intermediate layer provided thereon containing an alkali-soluble polymer obtained by copolymerizing a constituent having an acid group selected from the group consisting of —COOH, —SO$_3$H, —OSO$_3$H, —OPO$_3$H$_2$, —CONHSO$_2$, and —SO$_2$NHSO$_2$— and a constituent having an onium group and having a number-average molecular weight (Mn) adjusted to the range of 300 to 5,000 by using an initiator in combination with a chain transfer agent in radical polymerization, and a photosensitive layer provided on the intermediate layer.

2. The photosensitive lithographic printing plate as claimed in claim 1, wherein the constituent having an acid group is a polymerizable compound represented by the following general formula (1) or (2):

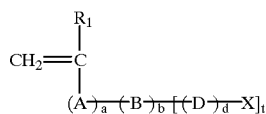

(1)

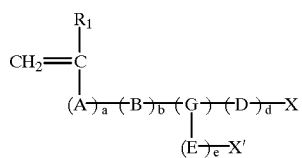

(2)

wherein A represents a divalent connecting group; B represents an aromatic group or a substituted aromatic group; D and E each independently represents a divalent connecting group; G represents a trivalent connecting group; X and X' each independently represents an acid group having a pKa of 7 or less, or an alkali metal salt or an ammonium salt thereof; R$_1$ represents a hydrogen atom, an alkyl group or a halogen atom; a, b, d and e each independently represents 0 or 1; and t is an integer of 1 to 3.

3. The photosensitive lithographic printing plate as claimed in claim 1, wherein the constituent having an onium group is a compound represented by the following general formula (3), (4) or (5):

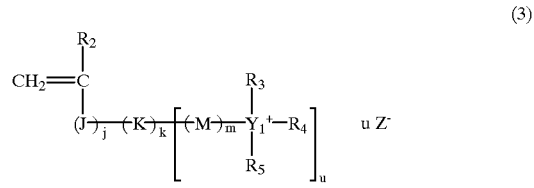

(3)

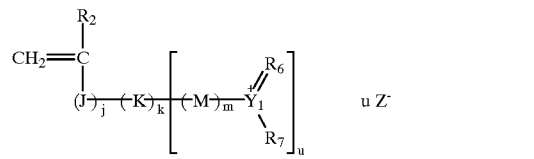

(4)

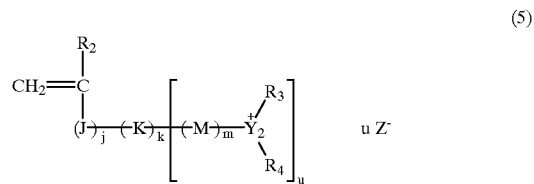

(5)

wherein J represents a divalent connecting group; K represents an aromatic group or a substituted aromatic group; M represents a divalent connecting group; Y$_1$ represents a group V atom in the periodic table, and Y$_2$ represents a group VI atom in the periodic table; Z$^-$ represents a counter anion; R$_2$ represents a hydrogen atom, an alkyl group or a halogen atom; R$_3$, R$_4$, R$_5$ and R$_7$ each independently represents a hydrogen atom, or an alkyl group, an aromatic group or an aralkyl group to which a substituent group may be bonded in some cases, and R$_6$ represents an alkylidine group or a substituted alkylidine group, wherein R$_3$ and R$_4$, or R$_6$ and R$_7$ may combine with each other to form a ring; j, k and m each independently indicates 0 or 1; and u indicates an integer of 1 to 3.

4. The photosensitive lithographic printing plate as claimed in claim 1, wherein the alkali-soluble polymer contains the constituent having an acid group in an amount of 20% or more.

5. The photosensitive lithographic printing plate as claimed in claim 4, wherein the alkali-soluble polymer contains the constituent having an acid group in an amount of 40% or more.

6. The photosensitive lithographic printing plate as claimed in claim 1, wherein the alkali-soluble polymer contains the constituent having an onium group in an amount of 1 mol % or more.

7. The photosensitive lithographic printing plate as claimed in claim 6, wherein the alkali-soluble polymer contains the constituent having an onium group in an amount of 5 mol % or more.

8. The photosensitive lithographic printing plate as claimed in claim 1, wherein the number-average molecular weight of the alkali-soluble polymer is from 500 to 4,800.

9. The photosensitive lithographic printing plate as claimed in claim 1, wherein the number-average molecular weight of the alkali-soluble polymer is from 800 to 4,500.

10. The photosensitive lithographic printing plate as claimed in claim 1, wherein the chain transfer agent has a chain transfer constant Cs×10$^4$ at 60° C. of 0.01 or more.

11. The photosensitive lithographic printing plate as claimed in claim 1, wherein the initiator is an azo compound.

12. The photosensitive lithographic printing plate as claimed in claim 1, wherein the photosensitive layer provided on the intermediate layer is the only photosensitive layer of the photosensitive lithographic printing plate.

13. A positive working photosensitive lithographic printing plate comprising an aluminum support hydrophilized after anodic oxidization, an intermediate layer provided thereon containing an alkali-soluble polymer obtained by copolymerizing a constituent having an acid group selected from the group consisting of —COOH, —$SO_3H$, —$OSO_3H$, —$OPO_3H_2$, —$CONHSO_2$, and —$SO_2NHSO_2$— and a constituent having an onium group and having a number-average molecular weight (Mn) adjusted to the range of 300 to 5,000 by using an initiator in combination with a chain transfer agent in radical polymerization, and a photosensitive layer provided on the intermediate layer.

* * * * *